(12) United States Patent
Tsukamoto et al.

(10) Patent No.: US 10,192,815 B2
(45) Date of Patent: Jan. 29, 2019

(54) WIRING BOARD AND SEMICONDUCTOR DEVICE

(71) Applicant: SHINKO ELECTRIC INDUSTRIES CO., LTD., Nagano-shi, Nagano (JP)

(72) Inventors: Kosuke Tsukamoto, Nagano (JP); Noriyoshi Shimizu, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/441,559

(22) Filed: Feb. 24, 2017

(65) Prior Publication Data

US 2017/0263545 A1 Sep. 14, 2017

(30) Foreign Application Priority Data

Mar. 10, 2016 (JP) ................. 2016-047204

(51) Int. Cl.
*H01L 23/498* (2006.01)
*H01L 21/48* (2006.01)
(Continued)

(52) U.S. Cl.
CPC ...... *H01L 23/49838* (2013.01); *H01L 21/486* (2013.01); *H01L 21/4853* (2013.01); *H01L 21/4857* (2013.01); *H01L 23/3121* (2013.01); *H01L 23/49822* (2013.01); *H01L 23/49827* (2013.01); *H01L 24/17* (2013.01); *H01L 25/0655* (2013.01); *H01L 24/81* (2013.01); *H01L 2224/13014* (2013.01); *H01L 2224/13144* (2013.01); *H01L 2224/16113* (2013.01); *H01L 2224/16168* (2013.01); *H01L 2224/16501* (2013.01); *H01L 2224/81193* (2013.01); *H01L 2224/81815* (2013.01);
(Continued)

(58) Field of Classification Search
None
See application file for complete search history.

(56) References Cited

U.S. PATENT DOCUMENTS 5,451,543 A * 9/1995 Woo .................. H01L 21/76816
257/E21.577
6,087,724 A * 7/2000 Shields ............. H01L 21/02134
257/734
(Continued)

FOREIGN PATENT DOCUMENTS

JP 2011-134957 7/2011

*Primary Examiner* — Abul Kalam
(74) *Attorney, Agent, or Firm* — Rankin, Hill & Clark LLP

(57) ABSTRACT

A wiring board includes: a first insulating layer; a first wiring layer formed on a lower surface of the first insulating layer; a first through hole which penetrates the first insulating layer; a first via wiring including: a filling portion formed to fill the first through hole; and a protruding portion protruding upward from an upper surface of the first insulating layer; a second wiring layer including a land, wherein the land includes an outer circumferential portion and a central portion, a second insulating layer formed on the upper surface of the first insulating layer; a second through hole which penetrates the second insulating layer in the thickness direction; a second via wiring formed to fill the second through hole; and a third wiring layer formed on an upper surface of the second insulating layer.

6 Claims, 13 Drawing Sheets

(51) Int. Cl.
  *H01L 23/31* (2006.01)
  *H01L 23/00* (2006.01)
  *H01L 25/065* (2006.01)
(52) U.S. Cl.
  CPC .............. *H01L 2924/014* (2013.01);
  *H01L 2924/0105* (2013.01); *H01L 2924/01022*
  (2013.01); *H01L 2924/01024* (2013.01); *H01L 2924/01028* (2013.01); *H01L 2924/01029*
  (2013.01); *H01L 2924/01046* (2013.01); *H01L 2924/01047* (2013.01); *H01L 2924/01073*
  (2013.01); *H01L 2924/01079* (2013.01); *H01L 2924/04941* (2013.01); *H01L 2924/04953*
  (2013.01); *H01L 2924/05432* (2013.01); *H01L 2924/05442* (2013.01); *H01L 2924/07025*
  (2013.01); *H01L 2924/1432* (2013.01); *H01L 2924/1436* (2013.01); *H01L 2924/1437*
  (2013.01); *H01L 2924/1438* (2013.01); *H01L 2924/1579* (2013.01); *H01L 2924/15747*
  (2013.01); *H01L 2924/15787* (2013.01)

(56) References Cited

U.S. PATENT DOCUMENTS

| | | | | |
|---|---|---|---|---|
| 6,355,552 | B1* | 3/2002 | Gayet | H01L 21/76816 257/E21.577 |
| 6,806,574 | B2* | 10/2004 | Cho | H01L 21/76804 257/758 |
| 7,666,783 | B2* | 2/2010 | Goller | H01L 21/76802 257/758 |
| 7,795,135 | B2* | 9/2010 | Eckert | H01L 21/76802 257/E21.577 |
| 2003/0148603 | A1* | 8/2003 | Gardner | H01L 21/76805 438/637 |
| 2011/0155442 | A1 | 6/2011 | Yamada | |

* cited by examiner

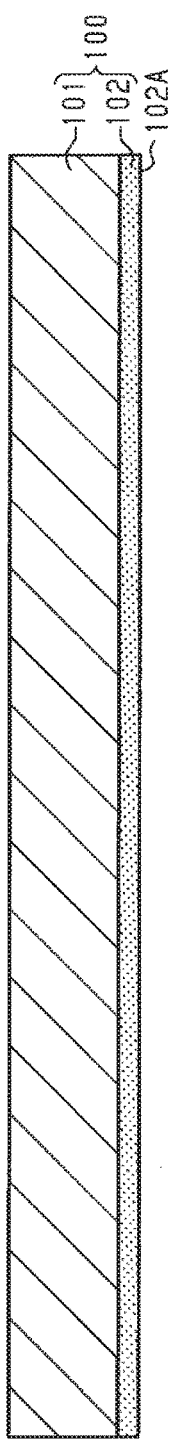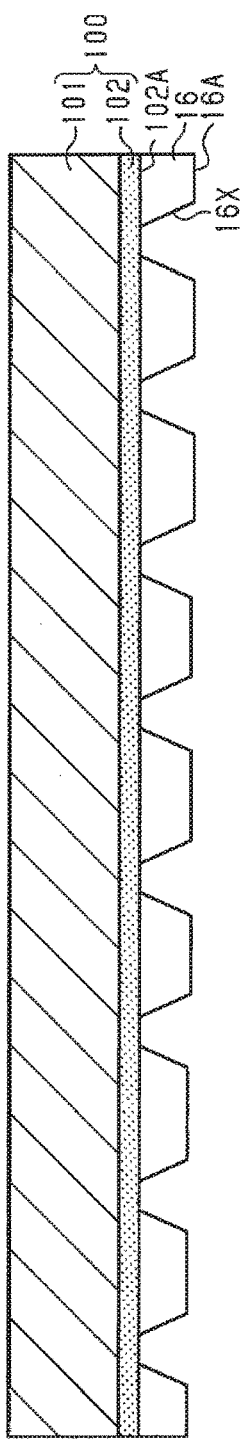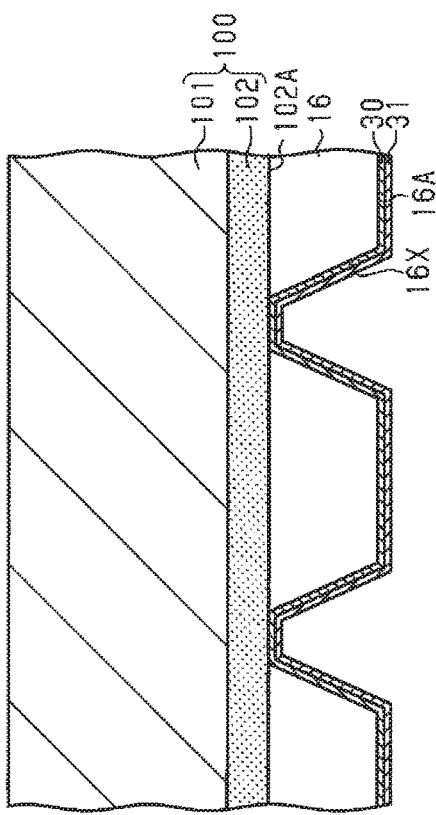

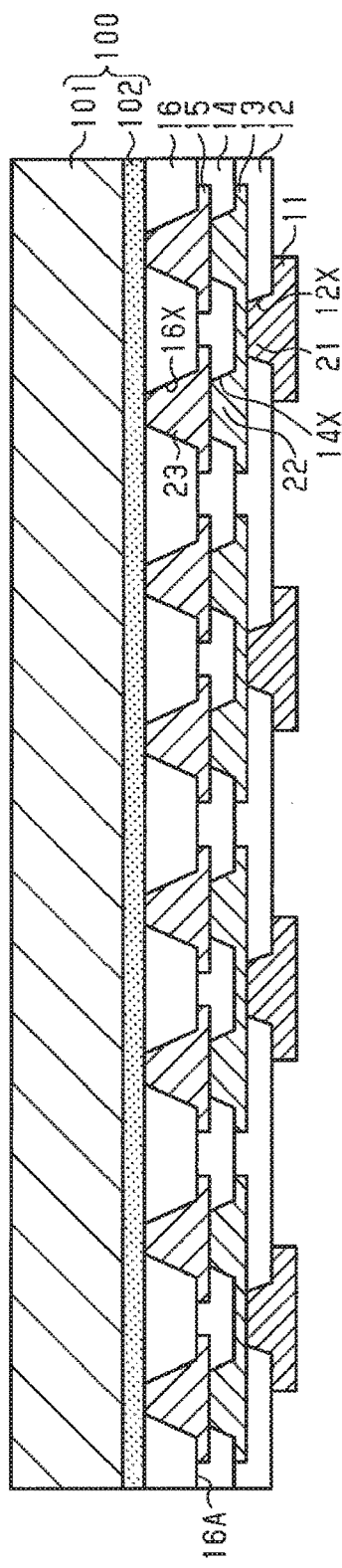
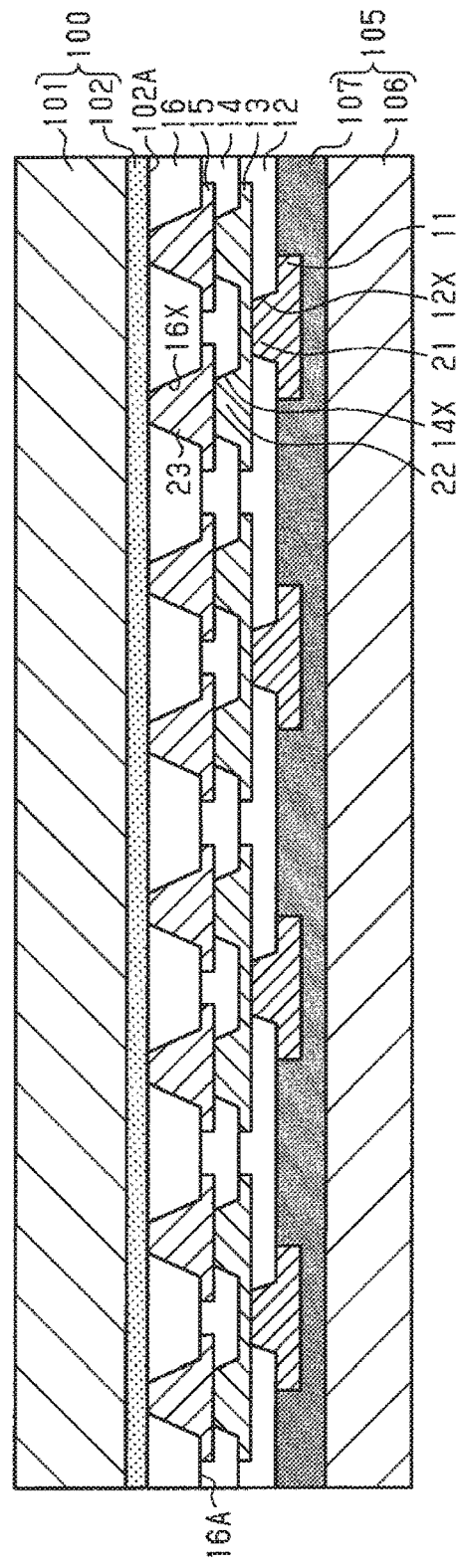
FIG. 5A
FIG. 5B

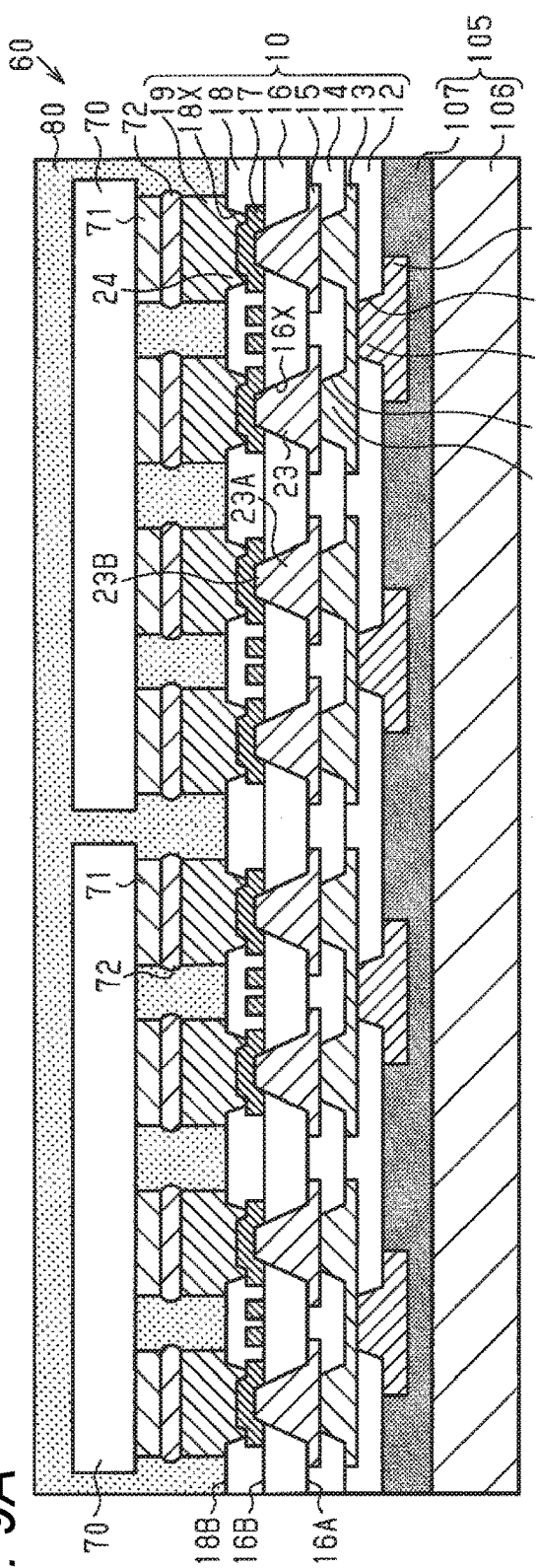
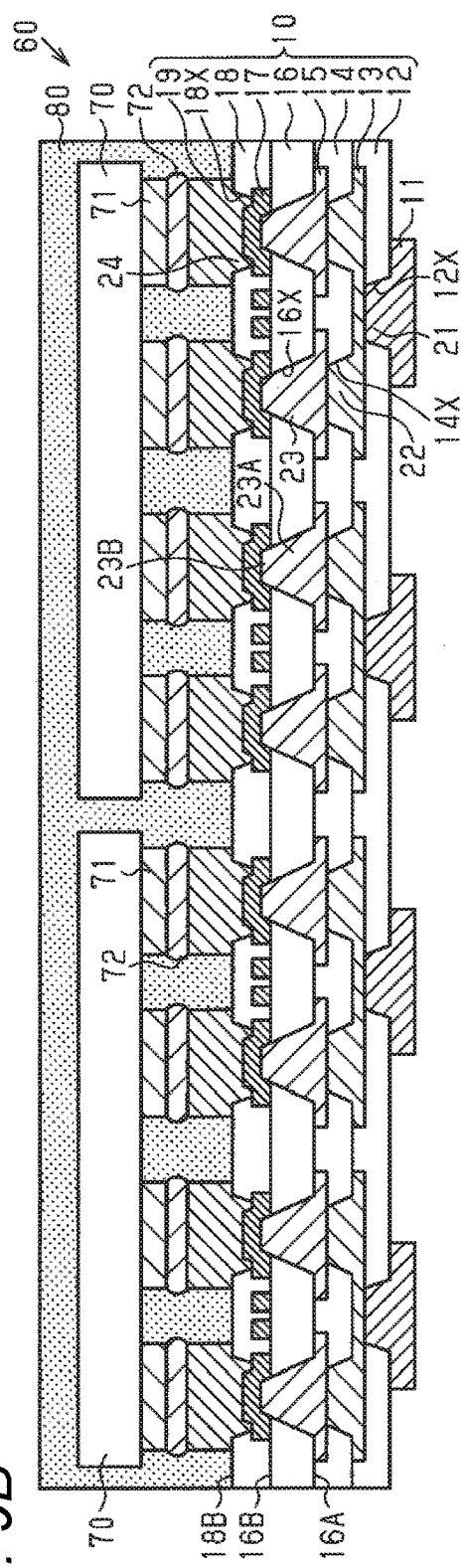
FIG. 9A
FIG. 9B

WIRING BOARD AND SEMICONDUCTOR DEVICE

This application claims priority from Japanese Patent Application No. 2016-047204, filed on Mar. 10, 2016, the entire contents of which are herein incorporated by reference.

BACKGROUND

1. Technical Field

The present disclosure relates to a wiring board and a semiconductor device.

2. Description of the Related Art

As wiring boards for mounting electronic components such as semiconductor chips thereon, wiring boards having various shapes and structures have been proposed. For example, there has been known a wiring board which has a structure in which an internal wiring layer is centered, insulating layers are formed respectively on opposite upper and lower sides of the internal wiring layer, and via wirings formed respectively in the insulating layers are connected to the internal wiring layer (e.g. see JP-A-2011-134957). Lands for securing conduction to the respective via wirings on the opposite upper and lower sides are formed on the internal wiring layer.

In recent years, a demand for micronization and density increase of wirings in a wiring board on which a semiconductor chip can be mounted has risen in accordance with higher integration and higher functionality of the semiconductor chip. However, when each land of the internal wiring layer is formed to have a smaller planar shape and each via wiring is formed to have a smaller diameter in the aforementioned wiring board, connection reliability between the land and the via wiring may be lowered.

SUMMARY

According to one or more aspects of the present disclosure, there is provided a wiring board.

The wiring board comprises:
a first insulating layer;
a first wiring layer formed on a lower surface of the first insulating layer;
a first through hole which penetrates the first insulating layer in a thickness direction of the first insulating layer;
a first via wiring comprising:
  a filling portion formed to fill the first through hole to be connected to the first wiring layer; and
  a protruding portion protruding upward from an upper surface of the first insulating layer;
a second wiring layer comprising a land, wherein the land comprises:
  an outer circumferential portion covering the upper surface of the first insulating layer; and
  a central portion formed integrally with the outer circumferential portion to cover a side surface and an upper surface of the protruding portion and protruding upward from an upper surface of the outer circumferential portion,
a second insulating layer formed on the upper surface of the first insulating layer to cover the second wiring layer;
a second through hole which penetrates the second insulating layer in the thickness direction to expose a side surface and an upper surface of the central portion;
a second via wiring formed to fill the second through hole to cover the side surface and the upper surface of the central portion; and
a third wiring layer formed on an upper surface of the second insulating layer to be connected to the second via wiring.

BRIEF DESCRIPTION OF THE DRAWINGS

FIGS. 3A and 3B are schematic sectional views showing a method for manufacturing the wiring board according to the embodiment;

FIG. 3C is an enlarged sectional view showing the method for manufacturing the wiring board according to the embodiment;

FIGS. 5A and 5B are schematic sectional views showing the method for manufacturing the wiring board according to the embodiment;

FIGS. 9A and 9B are schematic sectional views showing the method for manufacturing the semiconductor device according to the embodiment;

DETAILED DESCRIPTION

An embodiment will be described below with reference to the accompanying drawings. Incidentally, for convenience's sake, a portion regarded as a characteristic may be enlarged and shown in the accompanying drawings in order to make the characteristic easy to understand, but dimension ratios etc. of respective constituent elements are not always exactly the same as practical ones. In addition, in sectional views, in order to make sectional structures of respective members easy to understand, hatchings of some of the members are replaced by matt patterns and shown, and others of the members are not hatched.

Figure 1A:
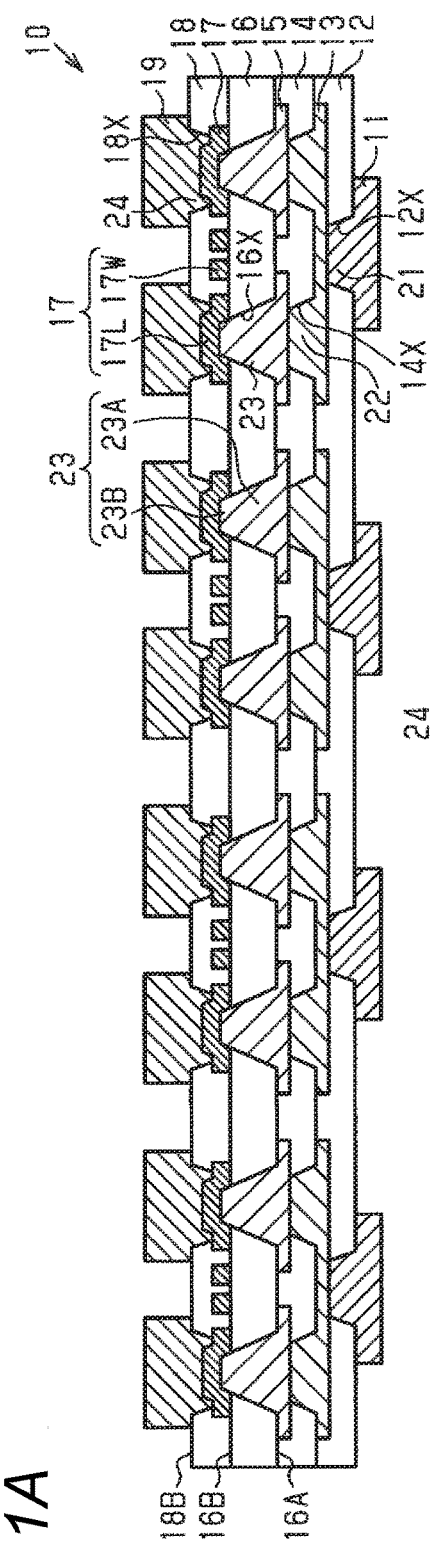
FIG. 1A is a schematic sectional view showing a wiring board according to an embodiment.

As shown in FIG. 1A, a wiring board 10 has a structure in which a wiring layer 11, an insulating layer 12, a wiring layer 13, an insulating layer 14, a wiring layer 15, an insulating layer 16, a wiring layer 17, an insulating layer 18, and a wiring layer 19 are formed in the named order.

For example, an insulating resin which contains a photosensitive resin such as a phenol-based resin or a polyimide-based resin as a main component can be used as the material of each of the insulating layers 12, 14, 16 and 18. For example, the insulating layer 12, 14, 16, 18 may contain a filler made of silica, alumina, etc. The insulating layer 16 is set to be, for example, thicker in thickness than any of the insulating layers 12, 14 and 18. For example, the insulating layers 12, 14 and 18 can be set to have substantially the same thickness. For example, each of the insulating layers 12, 14 and 18 can be set to be about 5 to 7 μm thick, and the insulating layer 16 can be set to be about 7 to 9 μm thick. Incidentally, for example, the insulating layer 16 may have the same thickness as the insulating layer 12, 14, 18.

The wiring layer 15, the insulating layer 14, the wiring layer 13, the insulating layer 12, and the wiring layer 11 are formed on a lower surface 16A of the insulating layer 16 in the named order. In addition, the wiring layer 17, the insulating layer 18, and the wiring layer 19 are formed on an upper surface 16B of the insulating layer 16 in the named order.

The wiring layer 15 is formed on the lower surface 16A of the insulating layer 16. The insulating layer 14 is formed on the lower surface 16A of the insulating layer 16 so that the wiring layer 15 can be covered with the insulating layer 14. Through holes 14X are formed at required places in the insulating layer 14 to penetrate the insulating layer 14 in a thickness direction to thereby expose portions of a lower surface of the wiring layer 15.

The wiring layer 13 is formed on a lower surface of the insulating layer 14. The wiring layer 13 is connected to the wiring layer 15 through via wirings 22 with which the through holes 14X of the insulating layer 14 are filled. For example, the wiring layer 13 is formed integrally with the via wirings 22. Incidentally, for example, copper (Cu) or a copper alloy can be used as the material of each of the wiring layer 13 and the via wirings 22.

The insulating layer 12 is formed on the lower surface of the insulating layer 14 so that the wiring layer 13 can be covered with the insulating layer 12. Through holes 12X are formed at required places in the insulating layer 12 to penetrate the insulating layer 12 in the thickness direction to thereby expose portions of a lower surface of the wiring layer 13.

The wiring layer 11 is formed on a lower surface of the insulating layer 12. The wiring layer 11 is connected to the wiring layer 13 through via wirings 21 with which the through holes 12X of the insulating layer 12 are filled. For example, the wiring layer 11 is formed integrally with the via wirings 21. For example, copper or a copper alloy can be used as the material of each of the wiring layer 11 and the via wirings 21. The wiring layer 11 can be set to be, for example, about 8 to 12 μm thick.

The wiring layer 11 serves as external connection pads to which external connection terminals can be connected. The external connection terminals are used when the wiring board 10 is mounted on a mount board such as a motherboard. Incidentally, a surface treatment layer may be formed on a surface (a side surface and a lower surface or only a lower surface) of the wiring layer 11 if occasions demand. A gold (Au) layer, a nickel (Ni) layer/Au layer (a metal layer in which an Ni layer and an Au layer are formed in the named order), an Ni layer/palladium (Pd) layer/Au layer (a metal layer in which an Ni layer, a Pd layer and an Au layer are formed in the named order), etc. can be enumerated as examples of the surface treatment layer. Here, the Au layer is a metal layer made of Au or an Au alloy. The Ni layer is a metal layer made of Ni or an Ni alloy. The Pd layer is a metal layer made of Pd or a Pd alloy. For example, a metal layer (electroless plating metal layer) formed by electroless plating can be used as each of the Ni layer, the Au layer and the Pd layer. Antioxidant treatment such as OSP (Organic Solderability Preservative) treatment may be applied to the surface of the wiring layer 11 to thereby form a surface treatment layer thereon. When, for example, OSP treatment is applied, a surface treatment layer based on organic coating of an azole compound, an imidazole compound etc. is formed on the surface of the wiring layer 11. Incidentally, the wiring layer 11 (or the surface treatment layer when the surface treatment layer is formed on the wiring layer 11) per se may be used as the external connection terminals.

Through holes 16X are formed at required places in the insulating layer 16 to penetrate the insulating layer 16 in the thickness direction. Via wirings 23 are formed in the through holes 16X so that the wiring layer 15 which is formed on the lower surface 16A of the insulating layer 16 and the wiring layer 17 which is formed on the upper surface 16B of the insulating layer 16 can be connected to each other through the via wirings 23. The via wirings 23 are formed to fill the through holes 16 so that the via wirings 23 can penetrate the insulating layer 16 in the thickness direction. Further, each via wiring 23 is formed so that an upper end portion of the via wiring 23 can protrude toward the wiring layer 19 side (upward in this case) from the upper surface 16B of the insulating layer 16. In other words, the via wiring 23 has a filling portion 23A and a protruding portion 23B. The filling portion 23A fills the through hole 16X to contact a side wall of the through hole 16X. The protruding portion 23B protrudes toward the wiring layer 19 side from the upper surface 16B of the insulating layer 16. Therefore, a step is formed in the upper surface 16B of the insulating layer 16 to extend along the upper surface 16B and a side surface and an upper surface of the protruding portion 23B. Incidentally, the via wiring 23 in this example is formed integrally with the wiring layer 15.

Here, each of the through holes 12X, 14X and 16X is formed into a tapered shape whose diameter (opening width) is gradually smaller from a lower side (wiring layer 11 side) toward an upper side (wiring layer 17 side) in FIG. 1A. For example, the through hole 12X, 14X, 16X is formed substantially into a truncated conical shape in which an opening diameter of a lower-side opening end is larger than an opening diameter of an upper-side opening end. That is, the through hole 12X, 14X, 16X is formed into a truncated conical shape whose diameter on the wiring layer 17 side is the smaller diameter. For example, the opening diameter of the lower-side opening end of the through hole 16X can be set in a range of about 8 to 15 μm, and the opening diameter of the upper-side opening end of the through hole 16X can be set in a range of about 6 to 12 μm.

In addition, each of the via wirings 21, 22 and 23 is formed into a tapered shape whose diameter (width) is gradually smaller from the lower side (wiring layer 11 side) toward the upper side (wiring layer 17 side) in FIG. 1A in the same manner as the through hole 12X, 14X, 16X. For example, the via wiring 21, 22, 23 is formed substantially into a truncated conical shape in which an area of a surface on the wiring layer 17 side (an upper end surface in this case) is smaller than an area of a surface on the wiring layer 11 side (a lower surface in this case). In the via wiring 23, both the filling portion 23A and the protruding portion 23B are formed substantially into the truncated conical shape. For example, the diameter of the lower surface of the via wiring 23 can be set in a range of about 8 to 15 μm, and the diameter of the upper end surface of the via wiring 23 can be set in a range of about 4 to 10 μm. For example, an entire height of the via wiring 23 can be set in a range of about 5 to 10 μm, and a height of the protruding portion 23B (i.e. a thickness between the upper surface 16B of the insulating layer 16 and the upper end surface of the protruding portion 23B) can be set in a range of about 1 to 2 μm.

Next, the structure of the wiring layer 15 and the via wiring 23 will be described in detail in accordance with FIG. 1B.

For example, the wiring layer 15 has a metal film 30, a metal film 31, and a metal layer 32. The metal film 30 is formed on the lower surface 16A of the insulating layer 16. The metal film 31 is formed on the metal film 30. The metal layer 32 is formed on the metal film 31. In addition, for example, the via wiring 23 has the metal film 30, the metal film 31, and a metal layer 33. Specifically, the filling portion 23A of the via wiring 23 has the metal film 30 which covers an inner side surface of the through hole 16X, the metal film 31 which covers a side surface of the metal film 30, and the metal layer 33 which fills the through hole 16X on an inner side than the metal film 31. In addition, the protruding portion 23B of the via wiring 23 has the metal layer 33 which protrudes upward from the upper surface 16B of the insulating layer 16, and the metal film 31 which covers an entire upper surface and an entire side surface of the metal layer 33 exposed from the upper surface 16B of the insulating layer 16. In other words, in the protruding portion 23B, an outer surface (one side surface and an upper surface) of the metal film 31 is not covered with the metal film 30 but exposed from the metal film 30.

The metal film 30 is formed so that the lower surface 16A of the insulating layer 16 and the inner side surface of the through hole 16X can be continuously covered with the metal film 30. The metal film 30 in this example is formed so that an upper end surface of the metal film 30 can be substantially flush with the upper surface 16B of the insulating layer 16. The metal film 31 is formed so that a lower surface of the metal film 30 and the side surface of the metal film 30 can be continuously covered with the metal film 31. The metal layer 32 is formed on a lower surface of the metal film 31 and the lower surface of the via wiring 23. The lower surface of the metal film 31 is formed on the lower surface 16A of the insulating layer 16. The metal layer 33 is formed to fill the through hole 16X on the inner side than the metal film 31 and to protrude upward from the upper surface 16B of the insulating layer 16. For example, the metal layer 33 is formed substantially into a truncated conical shape in which a lower surface is gradually larger than an upper end surface. In addition, the metal film 31 is formed so that an entire surface (the entire side surface and the entire upper surface) of the metal layer 33 can be covered with the metal film 31.

In the aforementioned via wiring 23, a step is formed along the upper end surface of the metal film 30 and the side surface and the upper surface of the metal layer 31 (the metal film 31 in the protruding portion 23B in this case) exposed from the metal film 30.

Here, for example, the metal film 30 serves as a tight contact layer which can improve tight contact properties between the insulating layer 16 and the metal film 31. In addition, for example, the metal film 30 serves as a barrier layer which can suppress Cu from being diffused from the metal film 31 or the metal layer 32 or 33 (e.g. a Cu layer) into the insulating layer 16. A metal material which is higher in tight contact properties with the insulating layer 16 than metal (e.g. Cu) forming the metal film 31 can be used as the material of the metal film 30. For example, titanium (Ti), titanium nitride (TiN), nickel (Ni), tantalum nitride (TaN), tantalum (Ta) or chromium (Cr) can be used as the material of such a metal film 30. For example, copper or a copper alloy can be used as the material of each of the metal film 31 and the metal layers 32 and 33. Incidentally, for example, a metal film (sputtered film) formed by sputtering can be used as each of the metal films 30 and 31. Moreover, for example, a metal layer (electrolytic plating metal layer) formed by electrolytic plating can be used as each of the metal layers 32 and 33. The metal film 30 can be set to be, for example, about 20 to 50 nm thick. The metal film 31 can be set to be, for example, about 100 to 300 nm thick. The metal layer 32 can be set to be, for example, about 2 to 3 μm thick.

As shown in FIG. 1A, the wiring layer 17 is formed on the upper surface 16B of the insulating layer 16. The wiring layer 17 is a wiring layer higher in wiring density than any other wiring layer 11, 13, 15 or 19. That is, each wiring width and each interval between adjacent wirings in the wiring layer 17 are smaller than each wiring width and each interval between adjacent wirings in the other wiring layer 11, 13, 15 or 19. The line-and-space (L/S) of the wiring layer 17 can be set, for example, at about 2 μm/2 μm. In addition, the line-and-space (L/S) of the other wiring layer 11, 13, 15 or 19 can be set, for example, at about 3 μm/3 μm to 5 μm/5 μm. Here, the line-and-space (L/S) expresses the wiring width and the interval between adjacent wirings.

The wiring layer 17 has lands 17L, and wiring patterns 17W. Each of the wiring patterns 17W is formed between adjacent ones of the lands 17L.

Figure 1B:
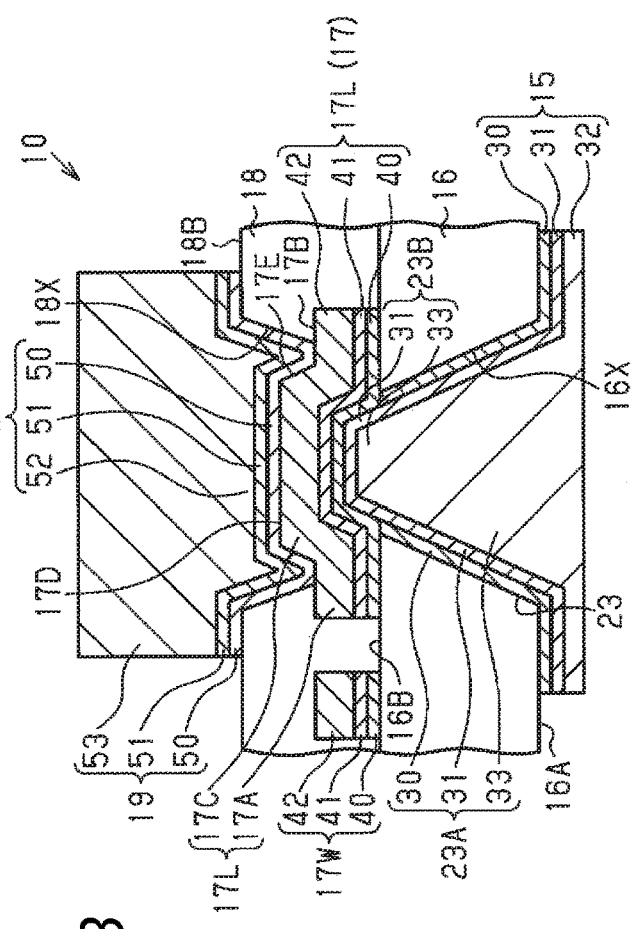
FIG. 1B is an enlarged sectional view in which a portion of the wiring board shown in FIG. 1A is enlarged.

As shown in FIG. 1B, for example, the wiring layer 17 has a metal film 40, a metal film 41, and a metal layer 42. The metal film 40 corresponding to each land 17L is formed to continuously cover the upper surface 16B of the insulating layer 16, the upper end surface of the metal film 30, and the side surface and the upper surface of the metal film 31 in the protruding portion 23B. In addition, the metal film 40 corresponding to each wiring pattern 17W is formed on the upper surface 16B of the insulating layer 16. The metal film 41 corresponding to the land 17L is formed to cover a side surface and an upper surface of the metal film 40. In addition, the metal film 41 corresponding to the wiring pattern 17W is formed to cover the upper surface of the metal film 40. The metal layer 42 corresponding to the land 17L is formed to cover a side surface and an upper surface of the metal film 41. The metal layer 42 corresponding to the wiring pattern 17W is formed to cover the upper surface of the metal film 41.

For example, the same material as that of the metal film 30 can be used as the material of the metal film 40. For example, the same material as that of the metal film 31 can be used as the material of the metal film 41. For example, the same material as that of the metal layer 32 can be used as the material of the metal layer 42. Incidentally, the metal film 40 serves as a tight contact layer and a barrier layer in the same manner as the metal film 30.

The land 17L is formed on the upper surface 16B of the insulating layer 16 so that the protruding portion 23B of the via wiring 23 can be covered with the land 17L. Specifically, the land 17L is formed to contact the entire side surface and the entire upper surface of the protruding portion 23B so that the entire side surface and the entire upper surface of the protruding portion 23B can be covered with the land 17L. Thus, the land 17L and the via wiring 23 (protruding portion 23B) are connected to each other three-dimensionally (stereoscopically). Accordingly, a contact area between the land 17L and the via wiring 23 can be made larger than that in a case where a lower surface of a land 17L and an upper end surface of a via wiring 23 are connected to each other two-dimensionally (planarly).

In addition, the land 17L is formed so that the step which is formed along the upper surface 16B of the insulating layer 16 and the side surface and the upper surface of the protruding portion 23B can be continuously covered with the land 17L. Specifically, the step which is formed along the upper surface 16B of the insulating layer 16, the upper end surface of the metal film 30, and the side surface and the upper surface of the metal film 31 in the protruding portion 23B is continuously covered with the land 17L, and the land 17L is therefore formed into a shape along the step. That is, the land 17L is formed into a shape having a step (unevenness). Specifically, the land 17L has an outer circumferential portion 17A and a central portion 17C. The outer circumferential portion 17A covers the upper surface 16B of the insulating layer 16. The central portion 17C is formed continuously to (integrally with) the outer circumferential portion 17A to cover the side surface and the upper surface of the protruding portion 23B. In addition, the central portion 17C protrudes upward from an upper surface 17B of the outer circumferential portion 17A. In the land 17L, the step is formed along an upper surface 17D of the central portion 17C, a side surface 17E of the central portion 17C (i.e. a side surface 17E which connects the upper surface 17B and the upper surface 17D to each other), and the upper surface 17B of the outer circumferential portion 17A.

For example, the outer circumferential portion 17A is formed to surround the central portion 17C. The upper surface 17B of the outer circumferential portion 17A is formed as a flat surface. The upper surface 17B is formed, for example, to be substantially parallel with the upper surface 16B of the insulating layer 16.

The central portion 17C is formed to cover the entire side surface and the entire upper surface of the protruding portion 23B. The upper surface 17D of the central portion 17C is positioned to be upper than the upper surface 17B of the outer circumferential portion 17A. The upper surface 17D of the central portion 17C is formed as a flat surface. For example, the upper surface 17D is formed as a flat surface so as to be substantially parallel with the upper surface of the protruding portion 23B. The side surface 17E of the central portion 17C is formed as an inclined surface in the same manner as the side surface of the protruding portion 23B. For example, the side surface 17E of the central portion 17C is formed so as to be inclined upward from the outer circumferential portion 17A side toward a center of the central portion 17C. For example, the side surface 17E of the central portion 17C is formed to be inclined linearly in sectional view. For example, of the central portion 17C, a portion protruding upward from the upper surface 17B is formed substantially into a truncated conical shape in which the upper surface 17D is smaller than a lower surface, in the same manner as the protruding portion 23B.

Here, the land 17L can be formed into any planar shape and with any size. For example, the planar shape of the land 17L can be formed as a circular shape having a diameter of about 18 to 25 μm. For example, the planar shape of the upper surface 17D of the central portion 17C can be formed as a circular shape having a diameter of about 1 to 5 μm. In addition, a thickness between the upper surface 16B of the insulating layer 16 and the upper surface 17B can be set, for example, to be about 2 μm. A thickness between the upper surface 17B and the upper surface 17D can be set, for example, to be about 1 to 2 μm.

The insulating layer 18 is formed on the upper surface 16B of the insulating layer 16 so that the wiring layer 17 can be covered with the insulating layer 18. Through holes 18X are formed at required places in the insulating layer 18 to penetrate the insulating layer 18 in the thickness direction so that portions of the lands 17L (the wiring layer 17) can be exposed in the through holes 18X. Each of the through holes 18X is formed to expose the upper surface 17D and the side surface 17E of the central portion 17C. Further, the through hole 18X in this example is formed to expose a portion of the upper surface 17B of the outer circumferential portion 17A. The through hole 18X is formed into a tapered shape whose diameter (opening width) is gradually smaller from the upper side (wiring layer 19 side) toward the lower side (wiring layer 17 side) in FIG. 1B. For example, the through hole 18X is formed substantially into an inverted truncated conical shape in which an opening diameter of an upper-side opening end is larger than an opening diameter of a lower-side opening end. That is, the through hole 18X is formed substantially into an inverted truncated conical shape whose diameter on the wiring layer 17 side is the smaller diameter. For example, the opening diameter of the lower-side opening end of the through hole 18X can be set in a range of about 10 to 15 μm, and the opening diameter of the upper-side opening end of the through hole 18X can be set in a range of about 12 to 20 μm. In addition, the through hole 18X can be set to be, for example, about 3 to 5 μm deep.

In this manner, the through hole 16X having the truncated conical shape whose diameter is gradually smaller toward the wiring layer 17 is formed on a lower surface side of the wiring layer 17. The through hole 18X having the inverted truncated conical shape whose diameter is gradually smaller toward the wiring layer 17 is formed on an upper surface side of the wiring layer 17. Specifically, as shown in FIG. 1A, in the wiring board 10, the through holes 12X, 14X, 16X and 18X have different structures with the wiring layer 17 (lands 17L) as a boundary, that is, between the upper side of the wiring layer 17 (lands 17L) and the lower side of the wiring layer 17 (lands 17L).

In addition, for example, the insulating layer 18 is formed to cover entire upper surfaces and entire side surfaces of the wiring patterns 17W.

The wiring layer 19 is formed on an upper surface 18B of the insulating layer 18. The wiring layer 19 is connected to the wiring layer 17 through via wirings 24 formed in the through holes 18X. The via wirings 24 are formed to fill the through holes 18X. Therefore, each of the via wirings 24 is formed into a tapered shape whose diameter (width) is gradually smaller from the wiring layer 19 side toward the wiring layer 17 side in the same manner as the through hole 18X. For example, the via wiring 24 is formed substantially into an inverted truncated conical shape in which an area of a surface (an upper surface in this case) on the wiring layer 19 side is larger than an area of a surface (a lower end surface in this case) on the wiring layer 17 side. For example, the diameter of the lower end surface of the via wiring 24 can be set in a range of about 10 to 15 µm, and the diameter of the upper surface of the via wiring 24 can be set in a range of about 12 to 20 µm.

As shown in FIG. 1B, the via wiring 24 is formed to contact an entire surface of the land 17L exposed in the through hole 18X so that the entire surface of the land 17L can be covered with the via wiring 24. Specifically, the via wiring 24 is formed to contact the entire upper surface 17D and the entire side surface 17E of the central portion 17C of the land 17L so that the entire upper surface 17D and the entire side surface 17E can be covered with the via wiring 24. Thus, the land 17L and the via wiring 24 are connected stereoscopically. Accordingly, a contact area between the land 17L and the via wiring 24 can be made larger than that in a case where an upper surface of a land 17L and a lower end surface of a via wiring 24 are connected in a two dimensional manner.

The wiring layer 19 is formed to protrude upward from the upper surface 18B of the insulating layer 18. For example, the wiring layer 19 is formed integrally with the via wiring 24. The wiring layer 19 can be formed into any planar shape and with any size. For example, the planar shape of the wiring layer 19 can be formed as a circular shape having a diameter of about 20 to 30 µm. A pitch of the wiring layer 19 can be set, for example, in a range of about 40 to 60 µm. The wiring layer 19 can be set to be, for example, about 8 to 12 µm thick. The wiring layer 19 serves as electronic component mounting pads in order to make electric connection with electronic components such as semiconductor chips 70 (see FIG. 2).

Incidentally, a surface treatment layer may be formed on a surface (an upper surface and a side surface or only an upper surface) of the wiring layer 19 if occasions demand. For example, the same layer as the surface treatment layer formed on the wiring layer 11 (see FIG. 1A) can be used as the surface treatment layer.

For example, the via wiring 24 has a metal film 50, a metal film 51, and a metal layer 52. For example, the wiring layer 19 has the metal film 50, the metal film 51 and a metal layer 53. The metal film 50 is formed to continuously cover the upper surface 18B of the insulating layer 18, an inner side surface of the through hole 18X, and the entire surface of the land 17L (specifically, the metal layer 42) exposed in a bottom portion of the through hole 18X. The metal film 51 is formed to cover a side surface and an upper surface of the metal film 50. The metal layer 52 is formed to fill the through hole 18X on an inner side than the metal film 51. The metal layer 53 is formed both on the metal films 50 and 51 formed on the upper surface 18B of the insulating layer 18, and on the metal layer 52. For example, the metal layer 53 is formed integrally with the metal layer 52.

For example, the same material as that of the metal film 30 can be used as the material of the metal film 50. For example, the same material as that of the metal film 31 can be used as the material of the metal film 51. For example, the same material as that of the metal layers 32 and 33 can be used as the material of the metal layers 52 and 53. Incidentally, the metal film 50 serves as a tight contact layer and a barrier layer in the same manner as the metal film 30.

Here, in the wiring board 10, the lands 17L of the wiring layer 17, the via wirings 23 connected to the lower surface sides of the lands 17L, the via wirings 24 connected to the upper surface sides of the lands 17L are formed in positions overlapping with one another in plan view. In addition, in the wiring layer 17, one land 17L is shared by a land connected to a via wiring 23 and a land connected to a via wiring 24. That is, each of the lands 17L serves not only as the land connected to the via wiring 23 but also as the land connected to the via wiring 24. The via wiring 23 and the via wiring 24 are electrically connected to each other via one land 17L. That is, the via wiring 23 and the via wiring 24 which are opposed to each other through the land 17L are electrically connected in an uniaxial manner. Here, "electrically conductively connected in an uniaxial manner" means that wiring patterns etc. are not arranged in a planar direction (a direction perpendicular to a direction in which the wiring board 10 is formed) but connected to each other through a conductor (the land 17L in this case) formed in the direction in which the wiring board 10 is formed. That is, the via wiring 23 is linearly connected in a position overlapping with the via wiring 24 in plan view.

Figure 2:
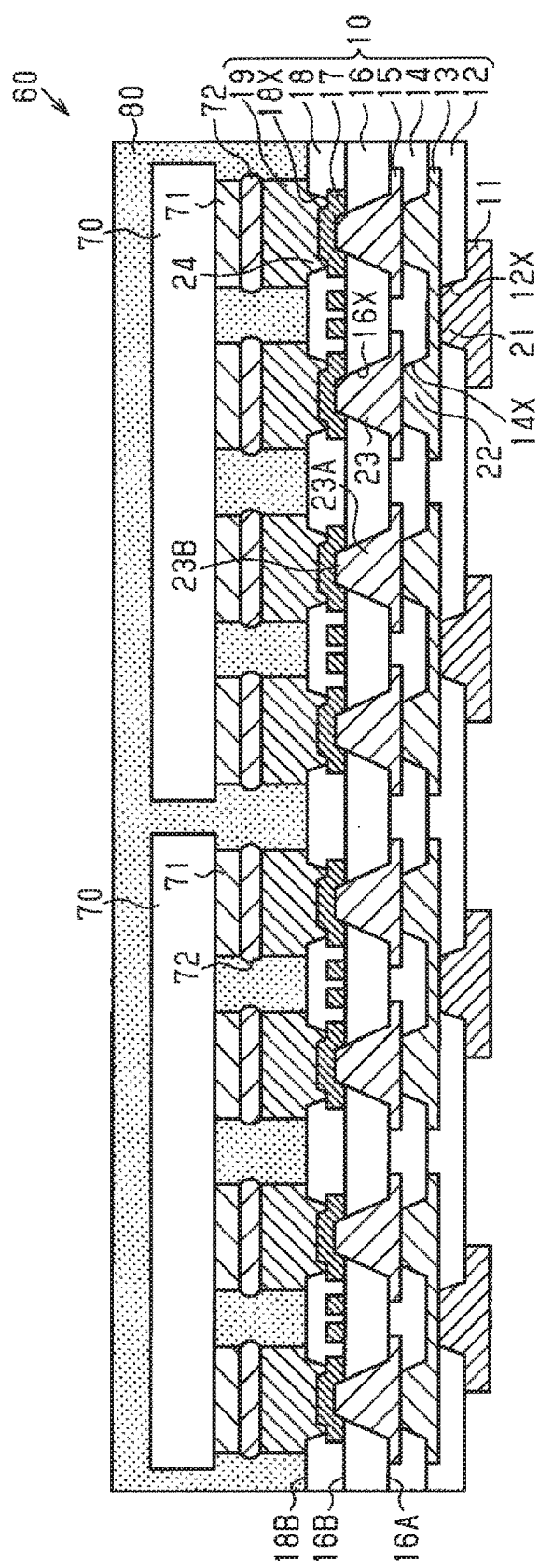
FIG. 2 is a schematic sectional view showing a semiconductor device according to the embodiment.

Next, a semiconductor device 60 will be described in accordance with FIG. 2. The semiconductor device 60 has the wiring board 10, one semiconductor chip or a plurality of (two in FIG. 2) semiconductor chips 70, and a sealing resin 80.

Each semiconductor chip 70 is flip-chip mounted on the wiring board 10. That is, when connection terminals 71 provided and disposed on a circuit formation surface (a lower surface in this case) of the semiconductor chip 70 are bonded to the wiring layer 19 of the wiring board 10 through a bonding member 72, the semiconductor chip 70 is electrically connected to the wiring layer 19 through the connection terminals 71 and the bonding member 72.

For example, a logic chip such as a CPU (Central Processing Unit) chip or a GPU (Graphics Processing Unit) chip can be used as the semiconductor chip 70. Moreover, for example, a memory chip such as a DRAM (Dynamic Random Access Memory) chip, an SRAM (Static Random Access Memory) chip or a flash memory chip may be used as the semiconductor chip 70. Incidentally, when a plurality of semiconductor chips 70 are mounted on the wiring board 10, the logic chip and the memory chip may be used in combination to be mounted on the wiring board 10.

For example, a metal post can be used as each of the connection terminals 71. The connection terminal 71 is a columnar connection terminal extending downward from the circuit formation surface of the semiconductor chip 70. For example, the connection terminal 71 in this example is formed into a cylindrical shape. For example, copper or a copper alloy can be used as the material of the connection terminal 71. In addition to the metal post, for example, a gold bump may be used as the connection terminal 71.

The bonding member 72 is bonded to the wiring layer 19, and bonded to the connection terminals 71. For example, a tin (Sn) layer or solder plating can be used as the bonding member 72. For example, an Sn-silver (Ag)-based, Sn—Cu-based, or Sn—Ag—Cu-based lead (Pb)-free solder can be used as the material of the solder plating.

The sealing resin 80 is formed on the upper surface 18B of the uppermost insulating layer 18 of the wiring board 10 so that the semiconductor chip 70 can be sealed with the sealing resin 80. The sealing resin 80 is formed to cover the circuit formation surface (the lower surface in this case), a back surface (an upper surface in this case) and a side surface of the semiconductor chip 70, and to cover the upper surface 18B of the insulating layer 18, the wiring layer 19, the connection terminals 71, and the bonding member 72.

For example, an insulating resin higher in mechanical strength (rigidity, hardness, etc.) than a photosensitive resin can be used as the material of the sealing resin 80. For example, a non-photosensitive insulating resin containing a thermosetting resin as a main component can be used as the material of the sealing resin 80. An insulating resin such as an epoxy resin or a polyimide resin, or any resin material in which a filler made of silica, alumina etc. is mixed into these resins can be used as the material of the sealing resin 80. For example, a molding resin can be used as the sealing resin 80. The sealing resin 80 can be set to be, for example, about 300 to 400 μm thick.

Next, a method for manufacturing the wiring board 10 and the semiconductor device 60 will be described.

In a step shown in FIG. 3A, a support substrate 100 which has a support body 101, and a release layer 102 formed on a lower surface of the support body 101 is prepared. For example, a plate-like material high in rigidity, such as silicon, glass or metal (e.g. copper) can be used as the material of the support body 101. For example, an ultraviolet releasable type adhesive agent whose adhesive force can be lowered by light energy of ultraviolet rays applied to the adhesive agent, or a heat releasable type adhesive agent whose adhesive force can be lowered by heat energy applied to the adhesive agent can be used as the release layer 102. In addition, for example, a laser releasable type adhesive agent whose adhesive force is lowered by energy of laser light applied to the adhesive agent can be also used as the release layer 102. The release layer 102 can be formed, for example, in such a manner that a sheet-like adhesive agent is pasted on the lower surface of the support body 101 or in such a manner that a varnish-like adhesive agent is applied on the lower surface of the support body 101.

Here, a lower surface of the support substrate 100, that is, a lower surface 102A of the release layer 102 is formed as a smooth surface (low roughness surface) with small unevenness. For example, roughness of the lower surface 102A of the release layer 102 is set, for example, to be about 15 to 50 nm in terms of surface roughness Ra value. Here, the surface roughness Ra value is called arithmetic average roughness, which is a kind of numerical value expressing surface roughness. Specifically, the surface roughness Ra value is calculated as follows. That is, heights varying within a measurement region are measured from a surface corresponding to an average line, and absolute values of the measured heights are arithmetically averaged.

Next, in a step shown in FIG. 3B, an insulating layer 16 having through holes 16X at required places is formed on the lower surface 102A of the release layer 102. For example, assume that a resin film is used as the insulating layer 16. In this case, the resin film is laminated on the upper surface 102A of the release layer 102 by thermocompression bonding, and the resin film is then patterned by photolithographing. In this manner, the insulating layer 16 is formed. Incidentally, for example, a film of a photosensitive resin such as a phenol-based resin or a polyimide-based resin can be used as the resin film. In addition, the insulating layer 16 may be formed alternatively as follows. That is, a liquid or paste-like insulating resin is applied on the lower surface 102A of the release layer 102 by spin coating etc., and the insulating resin is then patterned by photolithographing. Thus, the insulation layer 16 is formed. Incidentally, for example, a photosensitive resin such as a phenol-based resin or a polyimide-based resin can be used as the liquid or paste-like insulating resin. The insulating layer 16 on this occasion can be set to be, for example, about 8 to 10 μm thick. Incidentally, it is preferable that the thickness of the insulting layer 16 in this step is set in advance in consideration of a thickness of the resin which is designed to be thinned, so that the insulating layer 16 which has been thinned by an undermentioned step (see FIG. 7A) can be made as thick as each of insulating layers 12, 14 and 18 (see FIG. 1A) or can be made thicker than each of insulating layers 12, 14 and 18.

Incidentally, roughness of a lower surface 16A of the insulating layer 16 made of such an insulating resin containing a photosensitive resin as a main component can be set, for example, to be about 2 to 10 nm in terms of surface roughness Ra value. That is, the lower surface 16A of the insulating layer 16 is formed as a smooth surface (low roughness surface) with small unevenness.

Net, in a step shown in FIG. 3C, a metal film 30 is formed to cover entire inner surfaces of the through holes 16X (i.e. entire inner side surfaces of the through holes 16X and the entire lower surface 102A of the release layer 102 exposed in the through holes 16X) and the entire lower surface 16A of the insulating layer 16. Successively, a metal film 31 is formed to cover an entire surface (i.e. an entire lower surface and an entire side surface) of the metal film 30. These metal films 30 and 31 can be formed, for example, by sputtering.

Figure 4A:
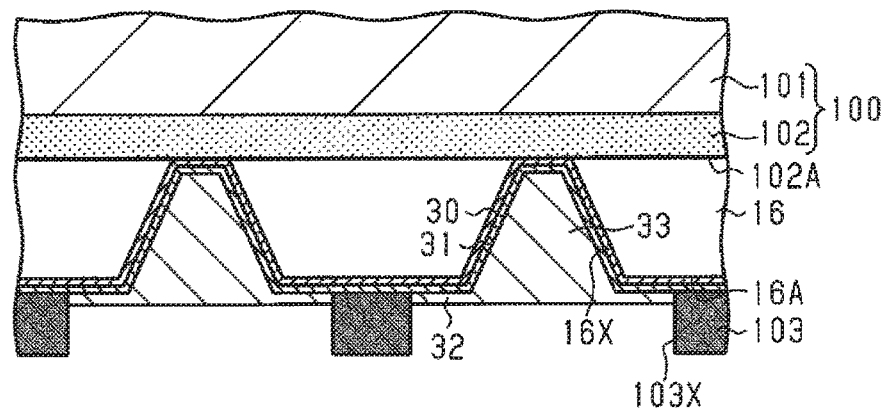
FIGS. 4A to 4C are enlarged sectional views showing the method for manufacturing the wiring board according to the embodiment.

Next, in a step shown in FIG. 4A, a resist layer 103 having opening patterns 103X at required places is formed on a lower surface of the metal film 31. The opening patterns 103X are formed to expose portions of the metal film 31 corresponding to regions where a wiring layer 15 (see FIG. 1A) should be formed. For example, a material plating-resistant to plating treatment in a subsequent step can be used as the material of the resist layer 103. For example, a photosensitive dry film resist or a liquid photoresist (e.g. a dry film resist or a liquid photoresist made of a novolac-based resin or an acrylic-based resin etc.) etc. can be used as the material of the resist layer 103. In the case where, for example, a photosensitive dry film resist is used, the resist layer 103 can be formed as follows. That is, a dry film is laminated on the lower surface of the metal film 31 by thermocompression bonding, and the dry film is then patterned by photolithographing. Thus, the resist layer 103 having the opening patterns 103X is formed. Incidentally, in the case where a liquid photoresist is used alternatively, the resist layer 103 can be also formed by a similar step.

Next, electrolytic plating (electrolytic copper plating in this case) using the metal films 30 and 31 as a plating power feeding layer is performed on the metal film 31 exposed from the opening patterns 103X of the resist layer 103, with the resist layer 103 as a plating mask. As a result, a metal layer 33 is formed to fill the through holes 16X on an inner side than the metal film 31, and a metal layer 32 is formed on the metal film 31 which has been formed on the lower surface 16A of the insulating layer 16.

Figure 4B:
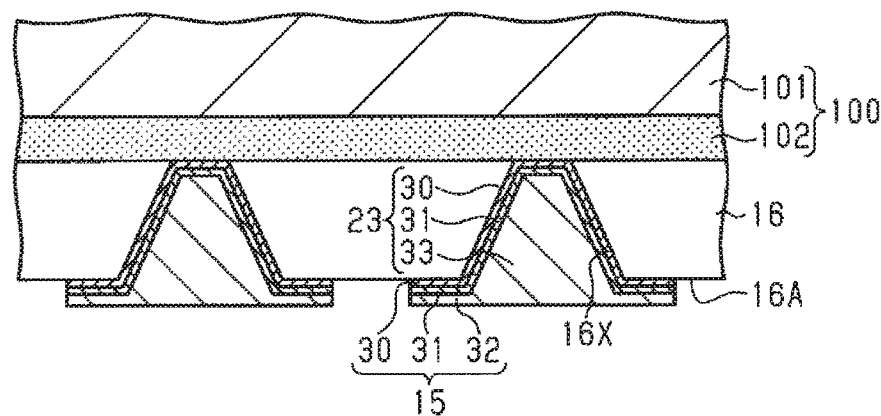

Successively, the resist layer 103 is removed, for example, by an alkaline release agent. Next, an unnecessary portion of the metal films 30 and 31 is removed by etching with the metal layer 32 as an etching mask. In the case where, for example, the metal film 31 is made of Cu, the metal film 31 is removed by wet etching using a sulfuric acid/hydrogen peroxide mixture-based etchant. In addition, in the case where, for example, the metal film 30 is made of Ti, the metal film 30 is selectively etched and removed with respect to the metal layer 32 by dry etching using etching gas of carbon tetrafluoride ($CF_4$) etc. or by wet etching using a potassium hydroxide (KOH)-based etchant. By this step, via wirings 23 including the metal films 30 and 31 and the metal layer 33 which are formed in the through holes 16X are formed in the through holes 16X, as shown in FIG. 4B. In addition, the wiring layer 15 including the metal layers 30 and 31 and the metal layer 32 which are formed on the lower surface 16A of the insulating layer 16 is formed on the lower surface 16A of the insulating layer 16. Thus, the wiring layer 15 and the via wirings 23 are formed by a semi-additive method.

Figure 4C:
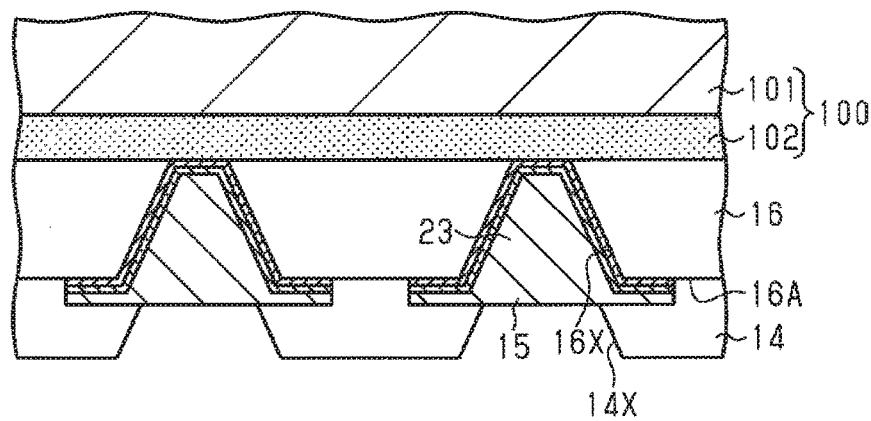

Next, in a step shown in FIG. 4C, an insulating layer 14 having through holes 14X to expose portions of a lower surface of the wiring layer 15 is formed on the lower surface 16A of the insulating layer 16 in the same manner as in the step shown in FIG. 3B.

Successively, in a step shown in FIG. 5A, via wirings 22 and a wiring layer 13 are formed, for example, by a semi-additive method, in the same manner as in the steps shown in FIGS. 3C to 4B. As a result, the via wirings 22 fill the through holes 14X, and the wiring layer 13 is formed on a lower surface of the insulating layer 14 so as to be electrically connected to the wiring layer 15 through the via wirings 22.

Next, an insulating layer 12 having through holes 12X to expose portions of a lower surface of the wiring layer 13 is formed on the lower surface of the insulating layer 14 in the same manner as in the step shown in FIG. 3B. Successively, via wirings 21 and a wiring layer 11 are formed, for example, by a semi-additive method, in the same manner as in the steps shown in FIGS. 3C to 4B. As a result, the via wirings 21 fill the through holes 12X, and the wiring layer 11 is formed on a lower surface of the insulating layer 12 so as to be electrically connected to the wiring layer 13 through the via wirings 21. Incidentally, a surface treatment layer may be formed on a surface (an upper surface and a side surface or an upper surface) of the wiring layer 11 if occasions demand.

Next, in a step shown in FIG. 5B, a support substrate 105 is bonded to the lower surface of the insulating layer 12. For example, the support substrate 105 has a support body 106, and a release layer 107 which is formed on an upper surface of the support body 106. For example, a surface of the support substrate 105 on a side where the release layer 107 is formed is pasted to the lower surface of the insulating layer 12. For example, a plate-like material high in rigidity, such as silicon, glass or metal (e.g. copper) can be used as the material of the support body 106. For example, an ultraviolet releasable type adhesive agent, a heat releasable type adhesive agent, or a laser releasable type adhesive agent can be used as the release layer 107.

Here, for example, the release layer 107 is preferably set to be thicker in thickness than the wiring layer 11. Specifically, the wiring layer 11 is, for example, about 8 to 12 μm thick, and the release layer 107 is, for example, about 30 to 50 μm thick. Due to the thicknesses of the wiring layer 11 and the release layer 107 set in this manner, the wiring layer 11 can be, for example, pressed into the sheet-like release layer 107 when the release layer 107 is laminated on the lower surface of the insulating layer 12 by thermocompression bonding. Thus, the entire side surface and an entire lower surface of the wiring layer 11 are covered with the release layer 107. When the wiring layer 11 is pressed into the release layer 107 in this manner, unevenness on the lower surface side of the insulating layer 12 generated due to the formation of the wiring layer 11 is absorbed by the release layer 107. Accordingly, it is possible to suppress occurrence of such a problem that adhesive force and tight contact force between the support substrate 105 and the insulating layer 12 may be lowered due to the unevenness. Incidentally, in the case where a varnish-like release layer 107 is applied to the lower surface of the insulating layer 12 alternatively, the entire side surface and the entire lower surface of the wiring layer 11 are covered with the release layer 107 in the same manner.

Figure 6A:
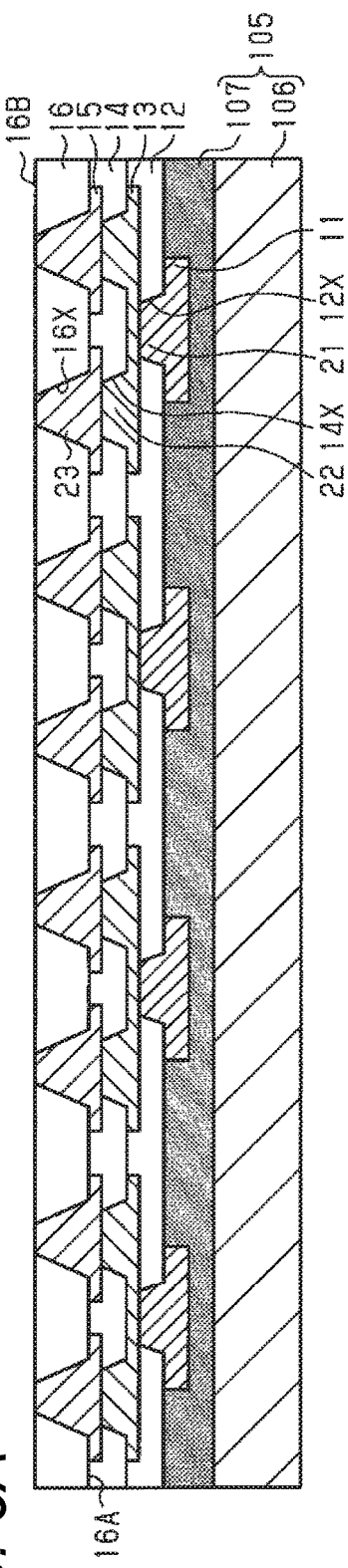
FIG. 6A is a schematic sectional view showing the method for manufacturing the wiring board according to the embodiment.
Figure 6B:
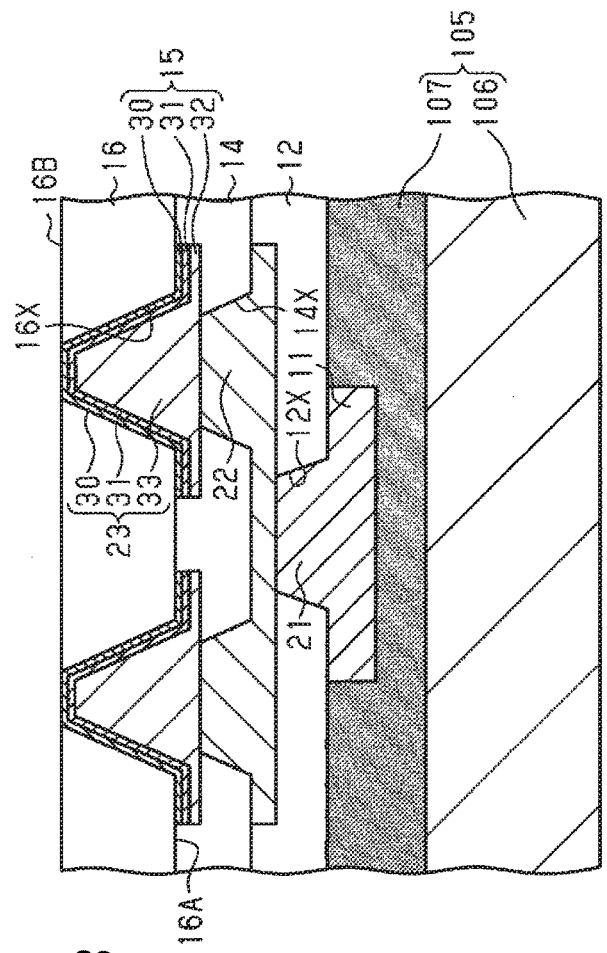
FIG. 6B is an enlarged sectional view showing the method for manufacturing the wiring board according to the embodiment.

Successively, the support substrate 100 is removed from the insulating layer 16. For example, first, irradiation of ultraviolet rays (in the case where the release layer 102 is an ultraviolet releasable type adhesive agent), heating (in the case where the release layer 102 is a heat releasable type adhesive agent) or irradiation of laser light (in the case where the release layer is a laser releasable type adhesive agent) is performed in order to lower adhesive force of the release layer 102. Successively, the release layer 102 and the support body 101 are mechanically released from the insulating layer 16. Thus, as shown in FIG. 6A, an upper surface 16B of the insulating layer 16 and upper end surfaces of the via wirings 23 are exposed to the outside. Specifically, as shown in FIG. 6B, the upper surface 16B of the insulating layer 16 and an upper surface of the metal film 30 are exposed to the outside. On this occasion, the upper surface 16B of the insulating layer 16 and the upper end surfaces of the via wirings 23 both of which contacted the lower surface 102A of the release layer 102 prior to the removal of the support substrate 100 as shown in FIG. 5B are formed into a shape along the lower surface 102A (smooth surface) of the release layer 102. That is, the shape of the lower surface 102A of the release layer 102 is transferred to the upper surface 16B of the insulating layer 16 and the upper end surfaces of the via wirings 23. Therefore, the upper surface 16B of the insulating layer 16 and the upper end surfaces of the via wirings 23 are formed into a smooth surface with small unevenness (e.g. a smooth surface having a surface roughness Ra value of about 15 to 50 nm).

Figure 7A:
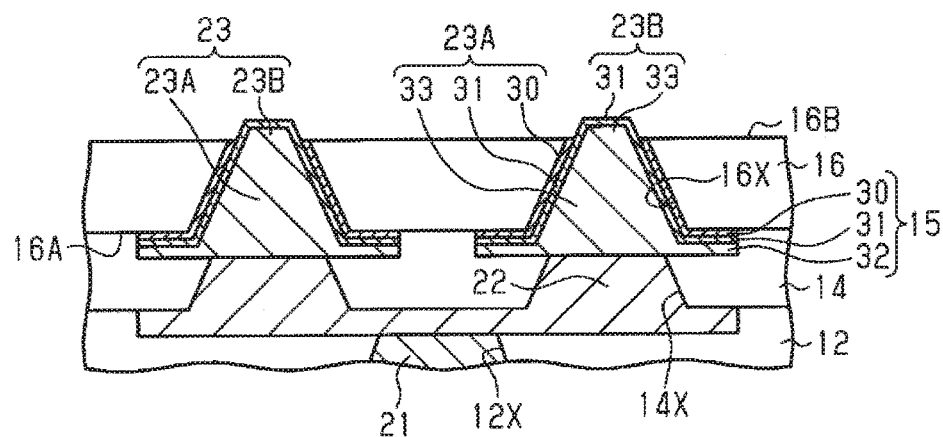
FIGS. 7A to 7C are enlarged sectional views showing the method for manufacturing the wiring board according to the embodiment.

Next, in a step shown in FIG. 7A, the insulating layer 16 is thinned from the upper surface 16B side. For example, the insulating layer 16 is thinned from the upper surface 16B side by dry etching (plasma etching) using etching gas of $CF_4$ etc. Specifically, the insulating layer 16 is thinned from the upper surface 16B side so that side surfaces of upper end portions of the via wirings 23 (side surfaces of upper sides of the via wirings 23) can be exposed from the upper surface 16B of the insulating layer 16. On this occasion, the metal film 30 (the Ti film) is also etched and removed simultaneously with the thinning of the insulating layer 16. That is, in this step, the metal film 30 is removed from the upper end surface sides of the via wirings 23 by the aforementioned dry etching. Thus, the upper end portions of the via wirings 23 are formed to protrude upward from the upper surface 16B of the insulating layer 16, and an outer surface (an upper surface and a side surface) of the metal film 31 in the upper end portions of the via wirings 23 is exposed to the outside. In other words, protruding portions 23B protruding upward from the upper surface 16B of the insulating layer 16 are formed. Due to the formation of the protruding portions 23B, steps are formed in the upper surface 16B of the insulating layer 16 to extend along the upper surface 16B of the insulating layer 16, an upper end surface of the metal film 30 and side surfaces and upper surfaces of the protruding portions 23B.

On this occasion, the upper surface 16B of the insulating layer 16 which has been thinned and the upper end surface of the metal film 30 which has been thinned are formed to be substantially flush with each other in this example. In other words, in this example, etching conditions (the kind of the etching gas, etc.) in the dry etching are adjusted appropriately so that an etching rate for the insulating layer 16 can be made substantially equal to that for the metal film 30.

Here, a removal amount of the insulating layer 16 in this step can be set, for example, in a range of about 1 to 2 μm. Therefore, the thickness of the insulating layer 16 which has been thinned is changed to about 7 to 9 μm. The insulating layer 16 which has been thinned may be as thick in thickness as the insulating layer 12, 14 or thicker in thickness than the insulating layer 12, 14. In other words, in this step, the removal amount of the insulating layer 16 is adjusted so that the insulating layer 16 which has been thinned can become as thick in thickness as the insulating layer 12, 14 or thicker in thickness than the insulating layer 12, 14.

Figure 7B:
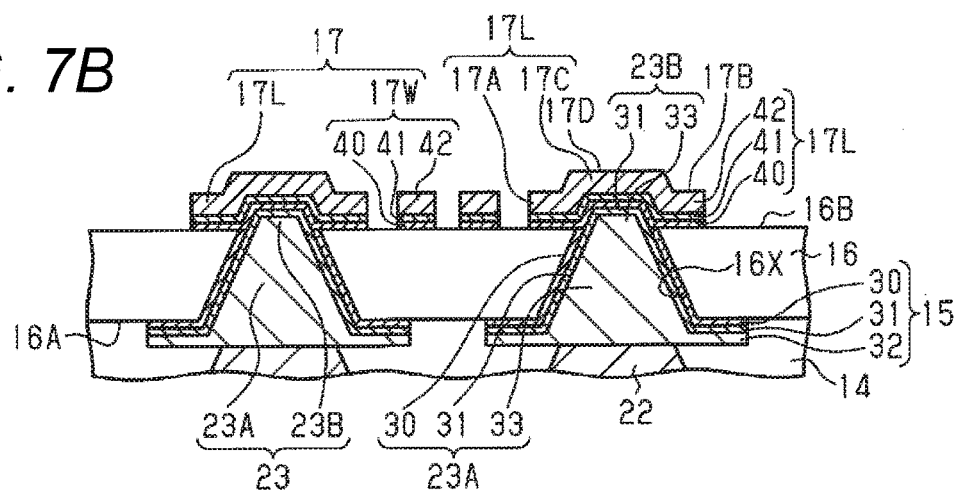

Successively, in a step shown in FIG. 7B, a wiring layer 17 is formed, for example, by a semi-additive method, in the same manner as in the steps shown in FIGS. 3C to 4B. Specifically, the wiring layer 17 is formed on the upper surface 16B of the insulating layer 16. The wiring layer 17 has lands 17L which are connected to the protruding portions 23B, and wiring patterns 17W each of which is formed between adjacent ones of the lands 17L. On this occasion, the lands 17L are formed along the steps formed by the protruding portions 23B. To give detailed description, in each of the lands 17L, an outer circumferential portion 17A and a central portion 17C are formed continuously to (integrally with) each other. The outer circumferential portion 17A covers the upper surface 16B of the insulating layer 16. The central portion 17C protrudes upward from an upper surface 17B of the outer circumferential portion 17A to cover the side surface and the upper surface of the via wiring 23. Here, the land 17L is constituted by a metal film 40 continuously covering the upper surface 16B of the insulating layer 16, the upper end surface of the metal film 30 and the side surface and the upper surface of the protruding portion 23B, a metal film 41 formed on the metal film 40, and a metal layer 42 formed on the metal film 41. In addition, the wiring pattern 17W is constituted by the metal film 40 formed on the upper surface 16B of the insulating layer 16, the metal film 41 formed on the metal film 40, and the metal layer 42 formed on the metal film 41.

Figure 7C:
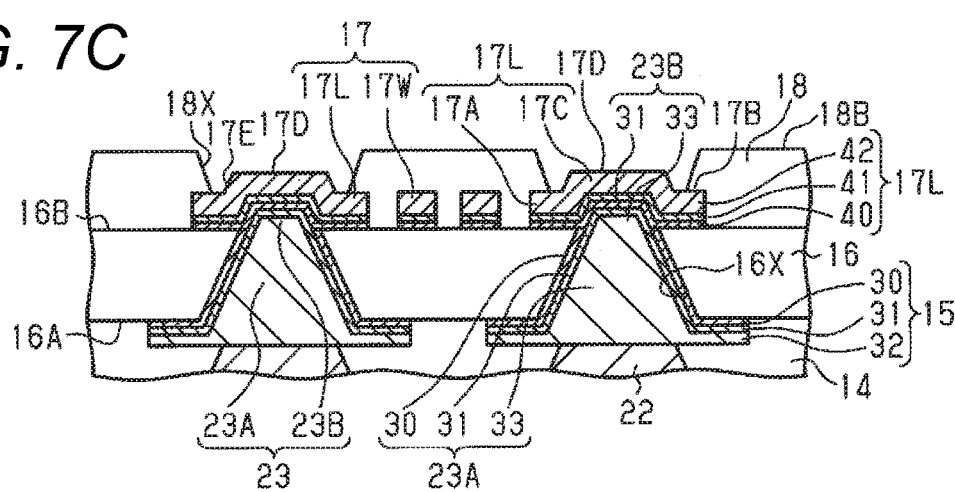

Next, in a step shown in FIG. 7C, an insulating layer 18 is formed on the upper surface 16B of the insulating layer 16 in the same manner as in the step shown in FIG. 3B, so that the wiring layer 17 can be covered with the insulating layer 18. The insulating layer 18 has through holes 18X which expose upper surfaces 17D and side surfaces 17E of the central portions 17C of the lands 17L. On this occasion, in the lands 17L, the central portions 17C are formed to protrude upward from the upper surfaces 17B of the outer circumferential portions 17A. Therefore, a thickness between the upper surface 17D of the central portion 17C of each land 17L and an upper surface 18B of the insulating layer 18 is thinner than a thickness between the upper surface 17B of the outer circumferential portion 17A of the land 17L and the upper surface 18B of the insulating layer 18. Thus, a portion of the through hole 18X overlapping with the central portion 17C in plan view can be formed shallowly. Accordingly, even when reduction of the diameter of the through hole 18X has advanced, the through hole 18X which exposes the central portion 17C can be formed suitably. That is, a residue of the insulating layer 18 can be prevented from easily staying behind on the central portion 17C. Incidentally, in this step, the insulating layer 18 is formed to cover an entire side surface and an entire upper surface of the wiring pattern 17W formed between adjacent ones of the lands 17L.

Figure 8A:
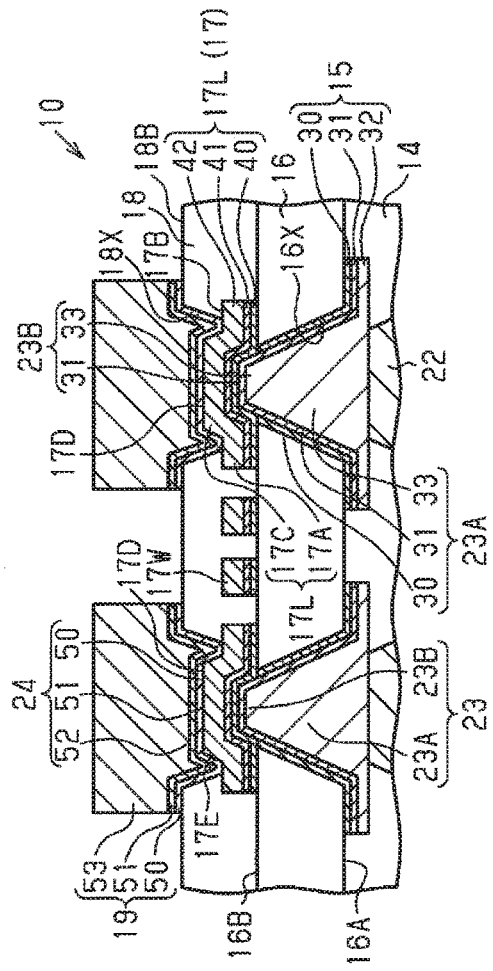
FIG. 8A is an enlarged sectional view showing the method for manufacturing the wiring board according to the embodiment.

Next, in a step shown in FIG. 8A, via wirings 24 and a wiring layer 19 are formed, for example, by a semi-additive method, in the same manner as in the steps shown in FIGS. 3C to 4B. As a result, the via wirings 24 fill the through holes 18X, and the wiring layer 19 is formed on the upper surface 18B of the insulating layer 18 to be electrically connected to the lands 17L through the via wirings 24. On this occasion, the via wirings 24 are formed to cover the entire upper surfaces 17D and the entire side surfaces 17E of the central portions 17C. Here, each of the via wirings 24 is constituted by a metal film 50 which covers an inner surface of the through hole 18X, a metal film 51 which is formed on the metal film 50, and a metal layer 52 which fills the through hole 18X on an inner side than the metal film 51. In addition, the wiring layer 19 is constituted by the metal film 50 which covers the upper surface 18B of the insulating layer 18, the metal film 51 which is formed on the metal film 50, and a metal layer 53 which is formed on the metal film 51 and on the metal layer 52. Incidentally, a surface treatment layer may be formed on a surface (an upper surface and a side surface or only an upper surface) of the wiring layer 19 if occasions demand.

Figure 8B:
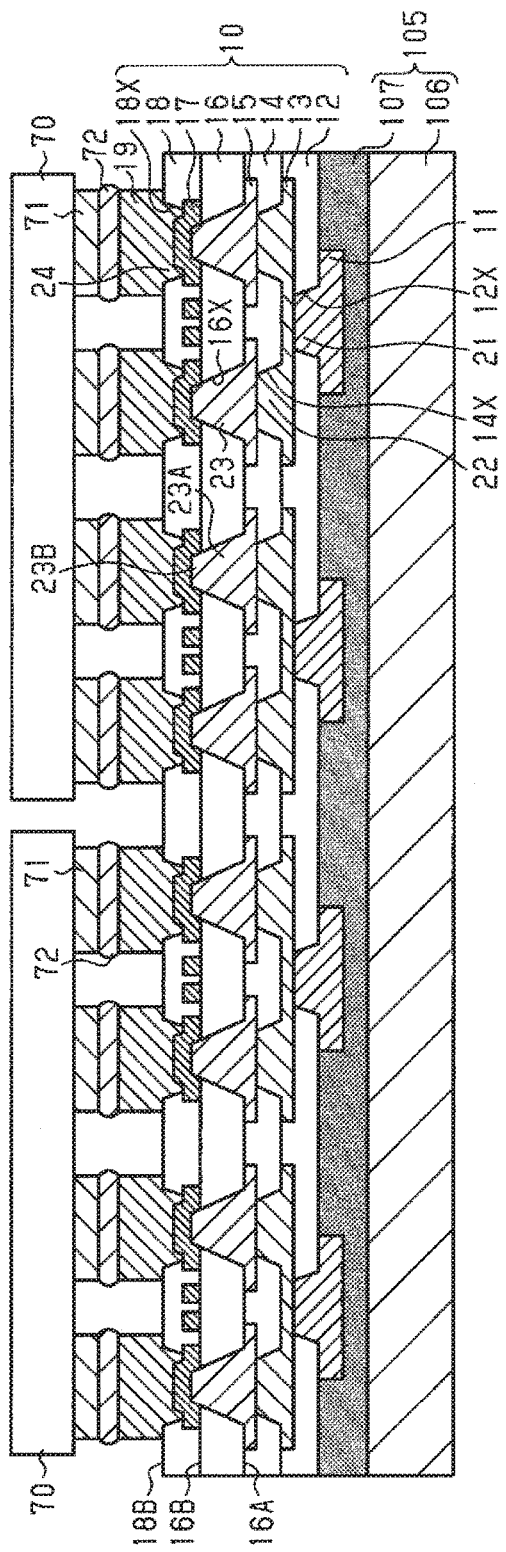
FIG. 8B is a schematic sectional view showing a method for manufacturing the semiconductor device according to the embodiment.

As shown in FIG. 8B, a wiring board 10 is formed on the support substrate 105 by the aforementioned manufacturing steps.

Next, semiconductor chips 70 are prepared. Each of the semiconductor chips 70 has connection terminals 71 which are formed on its circuit formation surface (its lower surface in this case), and a bonding member 72 which is formed on lower surfaces of the connection terminals 71. Successively, the connection terminals 71 of the semiconductor chip 70 are flip-chip bonded on the wiring layer 19. For example, assume that the bonding member 72 is a solder layer. In this case, the connection terminals 71 can be electrically connected to the wiring layer 19 in the following manner. That is, after the wiring layer 19 and the connection terminals 71 are aligned with each other, reflow treatment is performed to melt the bonding member 72 (the solder layer) to thereby electrically connect the connection terminals 71 to the wiring layer 19 through the bonding member 72.

Next, in a step shown in FIG. 9A, a sealing resin 80 is formed on the upper surface 18B of the insulating layer 18 so that the semiconductor chips 70 can be sealed with the sealing resin 80. For example, the sealing resin 80 is formed to entirely cover the semiconductor chips 70 so that surfaces of the wiring layer 19, the connection terminals 71 and the bonding members 72 can be covered with the sealing resin 80. For example, assume that a thermosetting molding resin is used as the material of the sealing resin 80. In this case, the sealing resin 80 can be formed in the following manner. That is, a structure body shown in FIG. 8B is received in a mold. The molding resin in a fluidized form is introduced into the mold with pressure (e.g. 5 to 10 MPa) applied thereto. Then, the molding resin is heated and hardened at a temperature of about 180° C. Thus, the sealing resin 80 is formed. Incidentally, for example, a method such as a transfer molding method, a compression molding method or an injection molding method can be used as the method for filling with the molding resin.

Successively, the support substrate 105 is removed from the wiring board 10. The removal of the support substrate 105 can be performed in the same manner as the removal of the support substrate 100. For example, after adhesive force of the release layer 107 is lowered due to irradiation of ultraviolet rays, heating or irradiation of laser light, the release layer 107 and the support body 106 are mechanically released from the wiring board 10 (insulating layer 12). Thus, as shown in FIG. 9B, the lower surface of the insulating layer 12 and the side surface and the lower surface of the wiring layer 11 are exposed to the outside. A semiconductor device 60 shown in FIG. 2 can be manufactured by the aforementioned manufacturing steps.

According to the aforementioned embodiment, the following effects can be obtained.

(1) The upper end portion (i.e. the protruding portion 23B) of each via wiring 23 is protruded from the upper surface 16B of the insulating layer 16, and the land 17L is formed to cover the side surface and the upper surface of the protruding portion 23B. Thus, the land 17L and the via wiring 23 (the protruding portion 23B) are stereoscopically connected to each other. Accordingly, the contact area between the land 17L and the via wiring 23 can be made larger than that in a case where a lower surface of a land 17L and an upper end surface of a via wiring 23 are connected to each other in two dimensional manner. As a result, reliability of electric connection between the land 17L and the via wiring 23 can be improved.

(2) The outer circumferential portion 17A and the central portion 17C which protrudes upward from the upper surface 17B of the outer circumferential portion 17A are formed in the land 17L, and the via wiring 24 is formed on the land 17L to cover the upper surface 17D and the side surface 17E of the central portion 17C. Thus, the land 17L and the via wiring 24 are stereoscopically connected to each other. Accordingly, the contact area between the land 17L and the via wiring 24 can be made larger than that in a case where an upper surface of a land 17L and a lower end surface of a via wiring 24 are connected to each other in two dimensional manner. As a result, reliability of electric connection between the land 17L and the via wiring 24 can be improved.

(3) The contact area between the land 17L and the via wiring 23, 24 can be made larger. Accordingly, the land 17L can be formed to have a smaller planar shape and the via wiring 23, 24 can be formed to have a smaller diameter. That is, even in the case where the land 17L is formed to have a smaller planar shape and the via wiring 23, 24 is formed to have a smaller diameter, the contact area between the land 17L and the via wiring 23, 24 can be secured sufficiently. Accordingly, high connection reliability between the land 17L and the via wiring 23, 24 can be maintained. Thus, the embodiment can easily support micronization and density increase of the wiring layers 15, 17 and 19.

(4) The central portion 17C protruding upward from the upper surface 17B of the outer circumferential portion 17A is formed in the land 17L. Therefore, the thickness between the upper surface 17D of the central portion 17C and the upper surface 18B of the insulating layer 18 can be made thinner than the thickness between the upper surface 17B of the outer circumferential portion 17A and the upper surface 18B of the insulating layer 18. Thus, the embodiment can easily support reduction of the diameter of the through hole 18X which exposes the upper surface 17D of the central portion 17C. In addition, when the through hole 18X is formed, a residue of the insulating layer 18 can be prevented from easily staying behind on the central portion 17C. Therefore, the via wiring 24 can be connected to the land 17L excellently.

(5) The through hole 16X, 18X is formed so that the diameter (opening width) of the through hole 16X, 18X is gradually smaller toward the land 17L. Thus, the planar shape of the land 17L can be reduced. Therefore, the embodiment can easily support micronization and density increase of the wiring layer 17.

(6) One land 17L can be shared by a land connected to the via wiring 23 and a land connected to the via wiring 24. With this configuration, the planar shape of the land 17L can be reduced.

Figure 10:
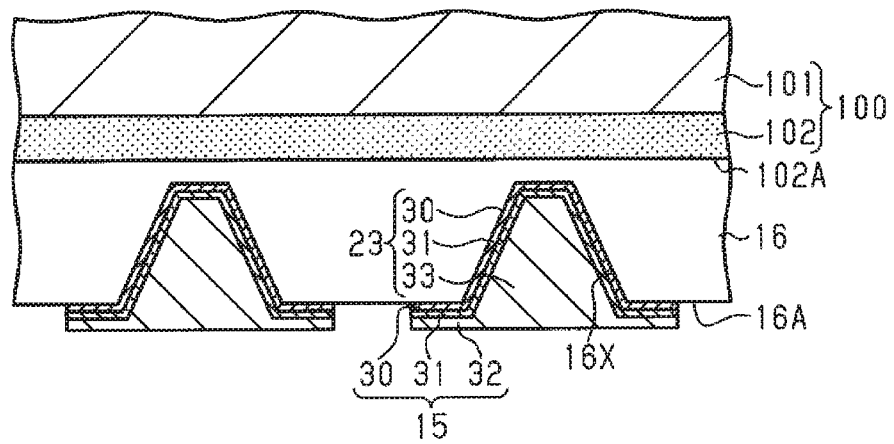
FIG. 10 is an enlarged sectional view showing a method for manufacturing a wiring board according to a modification.

(7) Since the insulating layer 16 is thinned from the upper surface 16B side, the upper end portion of the via wiring 23 is exposed from the upper surface 16B of the insulating layer 16. With this configuration, the insulating layer 16 can be thinned from the upper surface 16B side by a subsequent step (the step shown in FIG. 7A) even in the case where the through hole 16X which has been formed in the step shown in FIG. 3B is not deep enough to entirely penetrate the insulating layer 16 in the thickness direction as shown in FIG. 10. Accordingly, the upper end portion of the via wiring 23 can be exposed from the insulating layer 16 surely.

(8) The insulating layer 16 which has been thinned is formed to be thicker in thickness than the insulating layer 12, 14, 18. Accordingly, insulation reliability in the insulating layer 16 can be improved.

Other Embodiments

Incidentally, the aforementioned embodiment can be also carried out in the following modes in each of which the wiring board 10 is changed appropriately.

Figure 11:
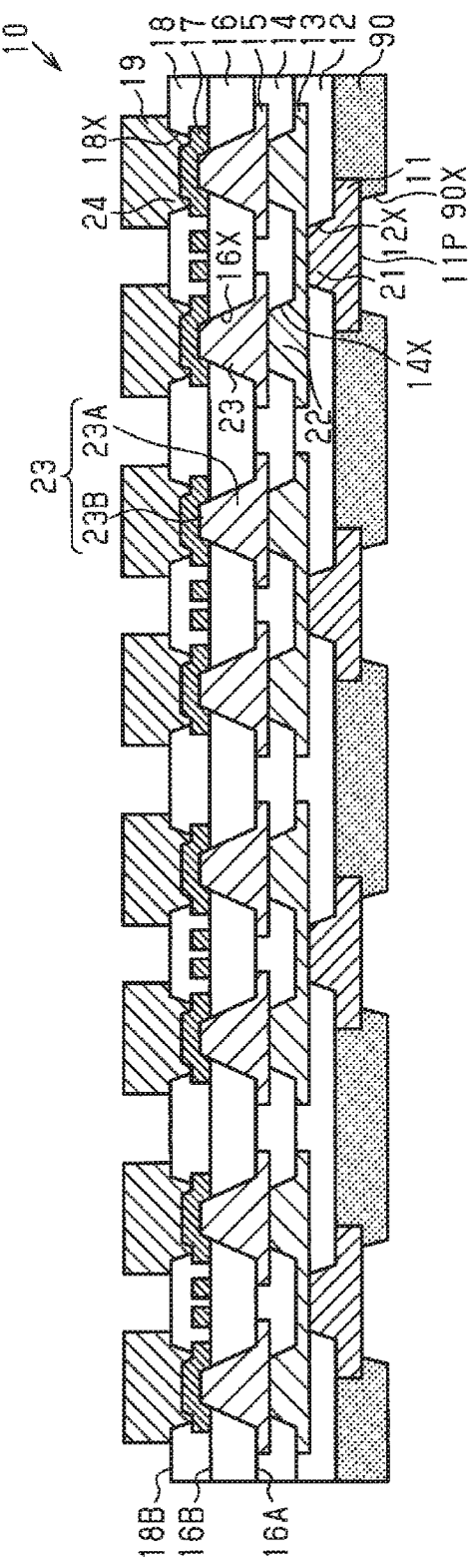
FIG. 11 is a schematic sectional view showing a wiring board according to a modification.

As shown in FIG. 11, a solder resist layer 90 may be formed on the lower surface of the insulating layer 12 to cover the wiring layer 11. For example, opening portions 90X for exposing portions of the lowermost wiring layer 11 as external connection pads 11P are formed in the solder resist layer 90. A surface treatment layer may be formed on the wiring layer 11 (i.e. on the external connection pads 11P) exposed in the opening portions 90X.

In this case, for example, the support substrate 105 is removed from the wiring board 10 after the wiring board 10 has been formed on the support substrate 105. The solder resist layer 90 is formed on the lower surface of the insulating layer 12 which has been exposed to the outside due to the removal of the support substrate 105.

Incidentally, the solder resist layer 90 is illustrated as an example of a protective insulating layer serving as an outermost layer of the wiring board 10 in the modification. However, the protective insulating layer can be formed out of various photosensitive insulating resins.

The protective insulating layer (e.g. the solder resist layer) may be formed on the upper surface 18B of the insulating layer 18 in the aforementioned embodiment.

In the aforementioned embodiment, the support substrate 105 is removed after the semiconductor chips 70 have been mounted on the wiring board 10 and the sealing resin 80 has been formed to seal the semiconductor chips 70. However, the timing for removing the support substrate 105 is not limited thereto. That is, as long as rigidity can be secured sufficiently by only a structure body from which the support substrate 105 has been removed, the timing for removing the support substrate 105 is not limited particularly. For example, the support substrate 105 may be removed immediately after the wiring board 10 has been formed on the support substrate 105. In this case, mounting of the semiconductor chips 70 and formation of the sealing resin 80 are performed after the support substrate 105 has been removed.

Figure 12:
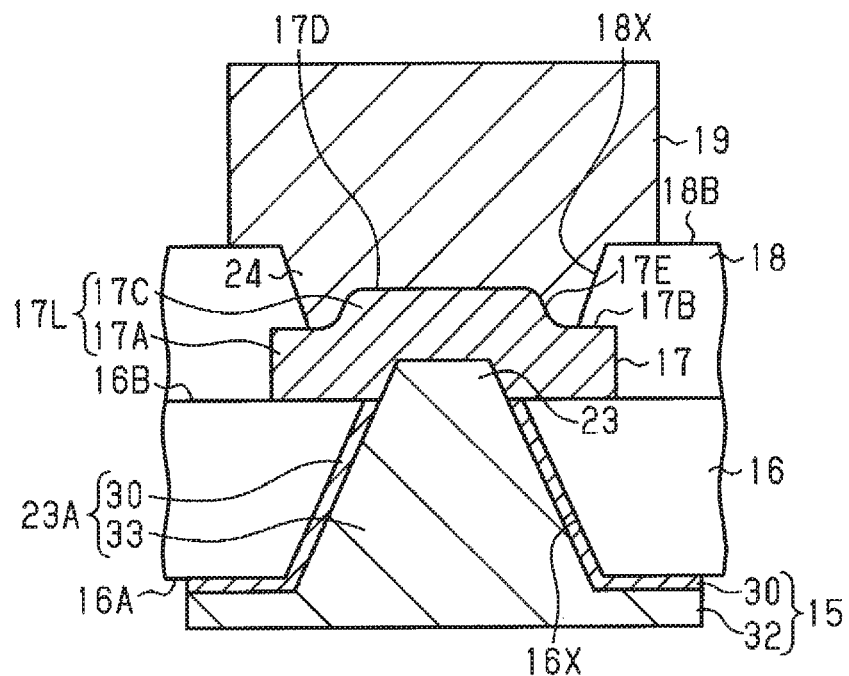
FIG. 12 is an enlarged sectional view showing a wiring board according to a modification.

As shown in FIG. 12, a corner portion of an outer side surface of the central portion 17C may be formed into a rounded shape (R-shape). Incidentally, illustration of the metal films 31, 40, 41, 50 and 51 and the metal layers 42, 52 and 53 shown in FIG. 1B are omitted from FIG. 12.

The upper surface 17D of the central portion 17C is formed as a flat surface in the aforementioned embodiment. The present disclosure is however not limited thereto. For example, the upper surface 17D of the central portion 17C may be, for example, formed as a convex curved surface.

The side surface 17E of the central portion 17C is formed to be inclined linearly in sectional view in the aforementioned embodiment. The present disclosure is however not limited thereto. For example, the side surface 17E of the central portion 17C may be formed as a curved surface.

The through hole 16X and the via wiring 23 are formed to have diameters which are gradually smaller from the wiring layer 15 side toward the wiring layer 17 side in the aforementioned embodiment. That is, the inner side surface of the through hole 16X and the outer circumferential surface of the via wiring 23 are formed as inclined surfaces. The present disclosure is however not limited thereto. The inner side surface of the through hole 16X and the outer circumferential surface of the via wiring 23 may be formed to extend substantially vertically to the lower surface 16A of the insulating layer 16 in sectional view. In this case, the side surface 17E of the central portion 17C may be formed to extend substantially vertically to the upper surface 17B of the outer circumferential portion 17A in sectional view in the same manner.

In the aforementioned embodiment, the through hole 18X and the via wiring 24 are formed to have diameters which are gradually smaller from the wiring layer 19 side toward the wiring layer 17 side. That is, the inner side surface of the through hole 18X and the outer circumferential surface of the via wiring 24 are formed as inclined surfaces. The present disclosure is however not limited thereto. The inner side surface of the through hole 18X and the outer circumferential surface of the via wiring 24 may be formed to extend substantially vertically to the upper surface 18B of the insulating layer 18 in sectional view.

Figure 13:
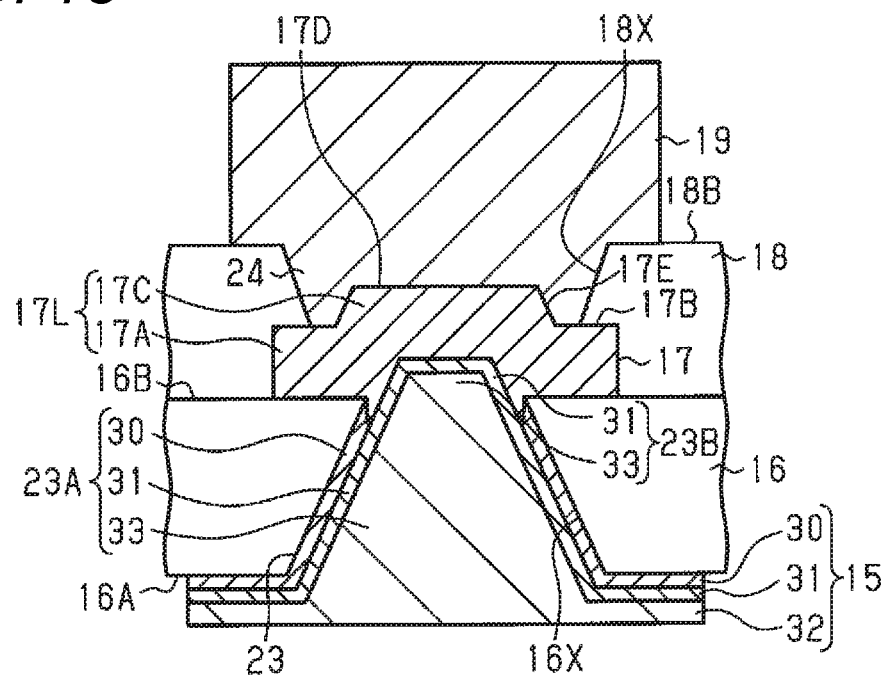
FIG. 13 is an enlarged sectional view showing a wiring board according to a modification.

In the aforementioned embodiment, the upper end surface of the metal film 30 and the upper surface 16B of the insulating layer 16 are formed to be substantially flush with each other. The present disclosure is however not limited thereto. For example, as shown in FIG. 13, the upper end surface of the metal film 30 may be formed to retract downward from the upper surface 16B of the insulating layer 16. In the via wiring 23 in this case, the step is formed along the upper end surface of the metal film 30 and the side surface and the upper surface of the metal film 31 exposed from the metal film 30. In addition, the upper end surface of the metal film 30 may be formed to protrude upward from the upper surface 16B of the insulating layer 16.

Incidentally, illustration of the metal films 40, 41, 50 and 51 and the metal layers 42, 52, and 53 shown in FIG. 1B is omitted from FIG. 13. The metal films 30, 40 and 50 in the aforementioned embodiment may be omitted.

Figure 14:
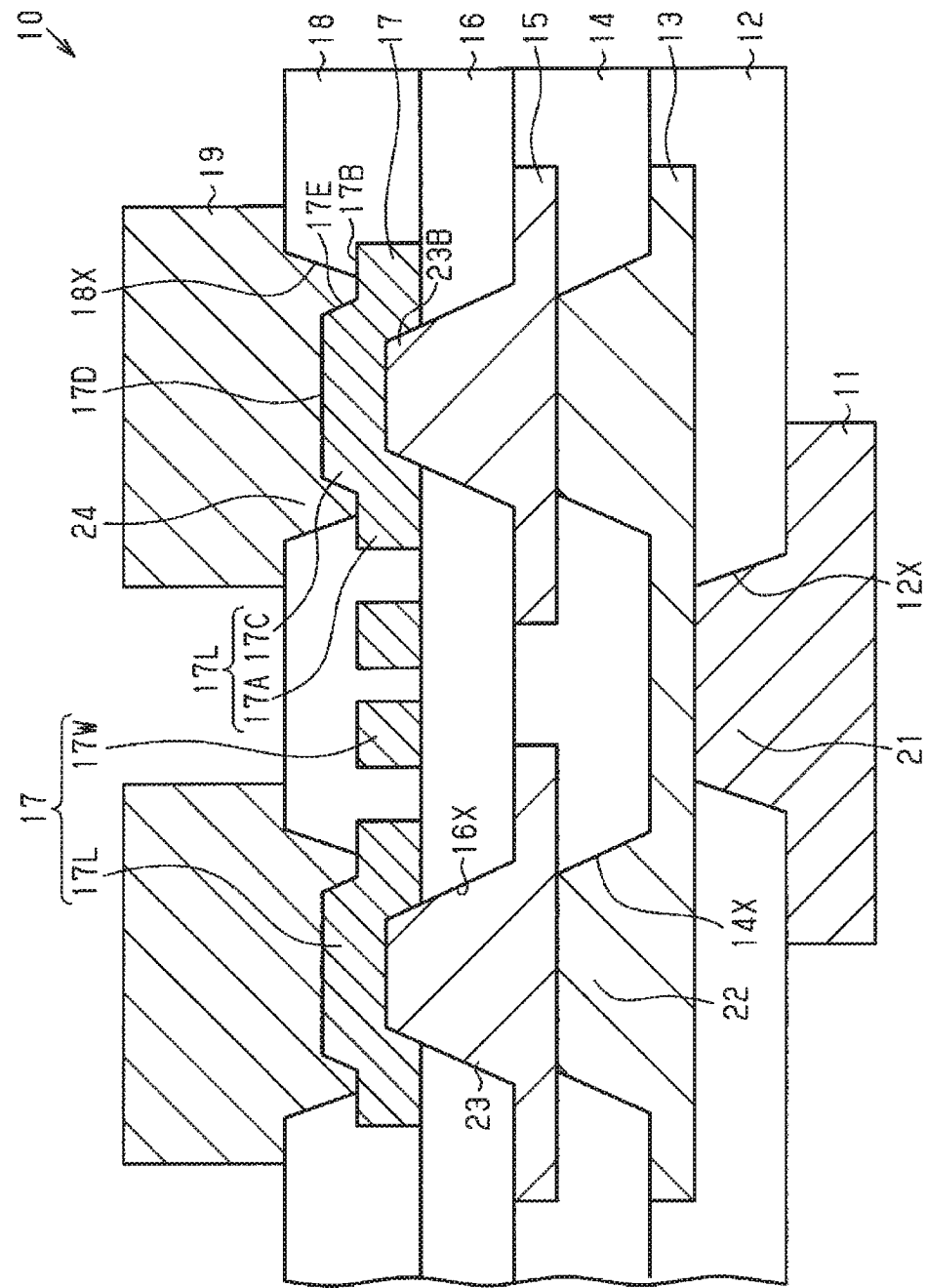
FIG. 14 is an enlarged sectional view showing a wiring board according to a modification.

In the aforementioned embodiment, the insulating layer 16 is set to be thicker in thickness than any of the other insulating layers 12, 14 and 18. The present invention is however not limited thereto. For example, as shown in FIG. 14, the insulating layer 16 may be set to be thinner in thickness than any of the other insulating layers 12, 14 and 18. The insulating layer 16 in this case can be set to be, for example, about 3 to 7 µm thick. When, for example, the insulating layer 16 is set to be thinner in thickness than any of the other insulating layers 12, 14 and 18, the entire thickness of the wiring board 10 can be reduced.

In this case, for example, in the thinning step shown in FIG. 7A, the removal amount of the insulating layer 16 can be adjusted so that the insulating layer 16 which has been thinned can be thinner in thickness than any of the insulating layers 12 and 14.

In the aforementioned embodiment, an insulating resin containing a photosensitive resin as a main component is used as the material of each of the insulating layers 12, 14 and 16. The present disclosure is however not limited thereto. An insulating resin containing a thermosetting resin as a main component may be used as the material of each of the insulating layers 12, 14 and 16.

In the aforementioned embodiment, one insulating layer 18 and one wiring layer 19 are formed on the upper surface 16B of the insulating layer 16. The present disclosure is however not limited thereto. A plurality of insulating layers and a plurality of wiring layers may be formed alternately on the upper surface 16B of the insulating layer 16.

The number of the wiring layers 11, 13, 15, 17 and 19 and the insulating layers 12, 14, 16 and 18 or arrangement of the wirings, etc. in the wiring board 10 in the aforementioned embodiment can be modified/changed variously.

In the aforementioned embodiment, the semiconductor chips 70 are mounted on the wiring board 10. The present disclosure is however not limited thereto. For example, an electronic component such as a chip component such as a chip capacitor, a chip resistor or a chip inductor or a crystal resonator may be mounted on the wiring board 10 in place of each of the semiconductor chips 70.

In addition, the mounting form (e.g. flip-chip mounting, wire bonding mounting, solder mounting or a combination of these mountings) etc. of the semiconductor chip 70 or the electronic component such as the chip component or the crystal resonator can be modified/changed variously.

In the aforementioned embodiment, the sealing resin 80 is formed to cover the back surfaces of the semiconductor chips 70. The present disclosure is however not limited thereto. The sealing resin 80 may be formed to expose the back surfaces of the semiconductor chips 70.

In the semiconductor device 60 in the aforementioned embodiment, an underfill resin may be formed between each semiconductor chip 70 and the wiring board 10. The aforementioned embodiment and the various modifications may be combined appropriately.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method for manufacturing a wiring board, the method comprising:
   (a) preparing a support substrate;
   (b) forming a first insulating layer having a first through hole on a lower surface of the support substrate;
   (c) forming a first via wiring to fill the first through hole with the first via wiring and forming a first wiring layer on a lower surface of the first insulating layer to connect the first wiring layer to the first via wiring;
   (d) removing the support substrate;
   (e) thinning the first insulating layer from a side of the upper surface of the insulating layer to expose a side surface of an upper end portion of the first via wiring from the first insulating layer;
   (f) forming a second wiring layer comprising a land wherein the land comprises: an outer circumferential portion covering the upper surface of the first insulating layer; and a central portion which is formed integrally with the outer circumferential portion to cover a side surface and an upper surface of the first via wiring protruding upward from the upper surface of the first insulating layer and which protrudes upward from an upper surface of the outer circumferential portion;

(g) forming a second insulating layer on the upper surface of the first insulating layer, wherein the second insulating layer has a second through hole exposing a side surface and an upper surface of the central portion; and (h) forming a second via wiring to fill the second through hole with the second via wiring, and forming a third wiring layer on an upper surface of the second insulating layer to connect the third wiring layer to the second via wiring.

2) The method of clause (1), wherein
the step (c) comprises:
(c1) forming a first metal film to cover an inner surface of the first through hole with the first metal film;
c2) forming a second metal film to cover the first metal film; and
c3) forming a metal layer to cover the second metal film, and
the step (e) comprises thinning the first insulating layer from the side of the upper surface of the insulating layer and thinning the first metal film from the side of the upper surface of the first metal film.

What is claimed is:

1. A wiring board comprising:
a first insulating layer;
a first wiring layer formed on a lower surface of the first insulating layer;
a first through hole which penetrates the first insulating layer in a thickness direction of the first insulating layer;
a first via wiring comprising:
 a filling portion formed to fill the first through hole and connected to the first wiring layer; and
 a protruding portion protruding upward from an upper surface of the first insulating layer;
a second wiring layer comprising a land, wherein the land comprises:
 an outer circumferential portion covering the upper surface of the first insulating layer; and
 a central portion formed integrally with the outer circumferential portion to cover a side surface and an upper surface of the protruding portion and protruding upward from an upper surface of the outer circumferential portion,
a second insulating layer formed on the upper surface of the first insulating layer to cover the second wiring layer;
a second through hole which penetrates the second insulating layer in the thickness direction to expose a side surface and an upper surface of the central portion;
a second via wiring formed to fill the second through hole to cover the side surface and the upper surface of the central portion; and
a third wiring layer formed on an upper surface of the second insulating layer and connected to the second via wiring, wherein
the filling portion comprises:
 a first metal film covering an inner side surface of the first through hole, the first metal film including an upper end surface that is planar with the upper surface of the first insulating layer;
 a second metal film covering the first metal film; and
 a metal layer covering the second metal film,
the protruding portion comprises:
 the metal layer protruding upward from the upper surface of the first insulating layer; and
 the second metal film covering a side surface and an upper surface of the metal layer exposed from the upper surface of the first insulating layer, and
the first via wiring has a step at a boundary between the protruding portion and the filling portion, the step formed along the upper end surface of the first metal film and a side surface and an upper surface of the second metal film, the side surface and the upper surface of the second metal film being exposed from the first metal film.

2. The wiring board of claim 1, wherein
the first through hole is formed such that a width of an opening end of the first through hole opposed to the second wiring layer is smaller than a width of an opening end of the first through hole opposed to the first wiring layer, and
the second through hole is formed such that a width of an opening end of the second through hole opposed to the second wiring layer is smaller than a width of an opening end of the second through hole opposed to the third wiring layer.

3. The wiring board of claim 1, wherein
a thickness of the first insulating layer is greater than that of the second insulating layer.

4. The wiring board of claim 1, wherein
the second wiring layer comprises:
a metal film covering the upper surface of the first insulating layer and the side surface and the upper surface of the protruding portion; and
a metal layer formed on the metal film.

5. The wiring board of claim 1, wherein
the second via wiring comprises:
a metal film covering an inner side surface of the second through hole and the side surface and the upper surface of the central portion exposed in the second through hole
a metal layer covering the metal film.

6. A semiconductor device comprising:
the wiring board of claim 1; and
an electronic component connected to the third wiring layer.

* * * * *